(12) United States Patent
Kim

(10) Patent No.: US 11,422,181 B2
(45) Date of Patent: Aug. 23, 2022

(54) SEMICONDUCTOR DEVICES INCLUDING THROUGH ELECTRODES

(71) Applicant: SK hynix Inc., Icheon-si (KR)

(72) Inventor: Chang Hyun Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 310 days.

(21) Appl. No.: 16/707,844

(22) Filed: Dec. 9, 2019

(65) Prior Publication Data

US 2021/0011074 A1    Jan. 14, 2021

(30) Foreign Application Priority Data

Jul. 9, 2019    (KR) ........................ 10-2019-0082903

(51) Int. Cl.
*G01R 31/26* (2020.01)
*H01L 25/065* (2006.01)

(52) U.S. Cl.
CPC ..... *G01R 31/2607* (2013.01); *G01R 31/2644* (2013.01); *H01L 25/0657* (2013.01); *H01L 2225/06541* (2013.01); *H01L 2225/06596* (2013.01)

(58) Field of Classification Search
None
See application file for complete search history.

(56) References Cited

U.S. PATENT DOCUMENTS

| | | | |
|---|---|---|---|
| 8,592,813 B2 * | 11/2013 | Sugawara | H01L 22/32 257/48 |
| 9,086,455 B2 | 7/2015 | Lai et al. | |
| 9,536,807 B2 * | 1/2017 | Kim | H01L 23/481 |
| 11,037,843 B2 * | 6/2021 | Nishioka | H01L 22/14 |
| 2009/0321910 A1 * | 12/2009 | Choi | H01L 23/481 257/686 |
| 2010/0315887 A1 * | 12/2010 | Park | G11C 29/1201 365/189.07 |
| 2013/0093454 A1 * | 4/2013 | Lai | G01R 31/318513 324/762.01 |
| 2013/0153899 A1 * | 6/2013 | Wada | H01L 23/49816 257/48 |

(Continued)

FOREIGN PATENT DOCUMENTS

| | | | | |
|---|---|---|---|---|
| CN | 102891666 A | * | 1/2013 | ......... G01R 31/2853 |
| KR | 101094916 B1 | | 12/2011 | |

OTHER PUBLICATIONS

English Translation of CN 102891666 A (Year: 2013).*

*Primary Examiner* — Jermele M Hollington
(74) *Attorney, Agent, or Firm* — William Park & Associates Ltd.

(57) ABSTRACT

A semiconductor device includes a first semiconductor chip and a second semiconductor chip stacked on the first semiconductor chip and electrically connected to the first semiconductor chip by a first through electrode and a second through electrode. The first semiconductor chip may electrically connect the first through electrode to a third test resistor during a second test operation. The first semiconductor chip may detect a voltage level of the first internal node, which is determined by resistance values of the third test resistor and the first and second through electrodes, to test a short failure between the first and second through electrodes during the second test operation.

28 Claims, 17 Drawing Sheets

(56) References Cited

U.S. PATENT DOCUMENTS

| | | | | |
|---|---|---|---|---|
| 2013/0162343 A1* | 6/2013 | Byeon | .................... | H01L 25/00 |
| | | | | 327/564 |
| 2013/0292846 A1* | 11/2013 | Lee | .................. | H01L 23/49827 |
| | | | | 257/774 |
| 2016/0254213 A1* | 9/2016 | Kim | ............... | G01R 31/318513 |
| | | | | 327/333 |

* cited by examiner

SEMICONDUCTOR DEVICES INCLUDING THROUGH ELECTRODES

CROSS-REFERENCE TO RELATED APPLICATIONS

The present application claims priority under 35 U.S.C 119(a) to Korean Application No. 10-2019-0082903, filed on Jul. 9, 2019, which is incorporated herein by reference in its entirety.

BACKGROUND

1. Technical Field

Embodiments of the present disclosure relate to semiconductor devices and through electrodes.

2. Related Art

Recently, three-dimensional semiconductor devices have been developed to increase the integration density thereof. Each of the three-dimensional semiconductor devices may be realized by vertically stacking a plurality of semiconductor chips to achieve a maximum integration density on a limited area.

Each of the three-dimensional semiconductor chips may be realized using a through silicon via (TSV) technique that electrically connects all of semiconductor chips vertically stacked to each other with silicon vias vertically penetrating the semiconductor chips. Accordingly, the three-dimensional semiconductor devices fabricated using the TSVs may efficiently reduce a packaging area thereof as compared with three-dimensional semiconductor devices fabricated using bonding wires.

In addition, the semiconductor devices or semiconductor packages including the semiconductor devices may be tested to verify the characteristics and reliability thereof before the semiconductor packages are supplied to users or customers. Thus, various methods of testing the semiconductor devices or the semiconductor packages have been proposed to reduce the test time and to enhance the test efficiency.

SUMMARY

According to an embodiment, a semiconductor device may include a first semiconductor chip and a second semiconductor chip stacked on the first semiconductor chip and electrically connected to the first semiconductor chip by a first through electrode and a second through electrode. The first semiconductor chip may electrically connect the first through electrode to a third test resistor during a second test operation. The first semiconductor chip may detect a voltage level of the first internal node, which is determined by resistance values of the third test resistor and the first and second through electrodes, to test a short failure between the first and second through electrodes during the second test operation.

According to an embodiment, a semiconductor device may include a first semiconductor chip and a second semiconductor chip stacked on the first semiconductor chip. The first semiconductor chip may be electrically connected to the first semiconductor chip by a first through electrode and a second through electrode. The first semiconductor chip may electrically connect the first and second through electrodes to first and second test resistors during a first test operation. The first semiconductor chip may detect voltage levels of first and second internal nodes to test open failures of the first and second through electrodes during the first test operation. The voltage levels of first and second internal nodes may be determined by resistance values of the first and second test resistors and the first and second through electrodes.

According to another embodiment, a semiconductor device may include a first semiconductor chip and a second semiconductor chip stacked on the first semiconductor chip. The first semiconductor chip may be electrically connected to the first semiconductor chip by a first through electrode and a second through electrode. During a first test operation, the first semiconductor chip may be configured to electrically connect the first and second through electrodes to first and second test resistors and is configured to detect voltage levels of first and second internal nodes to test open failures of the first and second through electrodes. In such a case, the voltage levels of first and second internal nodes may be determined by resistance values of the first and second test resistors and the first and second through electrodes. During a second test operation, the first semiconductor chip may be configured to electrically connect the first through electrode to a third test resistor and is configured to detect a voltage level of the first internal node to test a short failure between the first and second through electrodes. In such a case, the voltage level of the first internal node may be determined by resistance values of the third test resistor and the first and second through electrodes.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
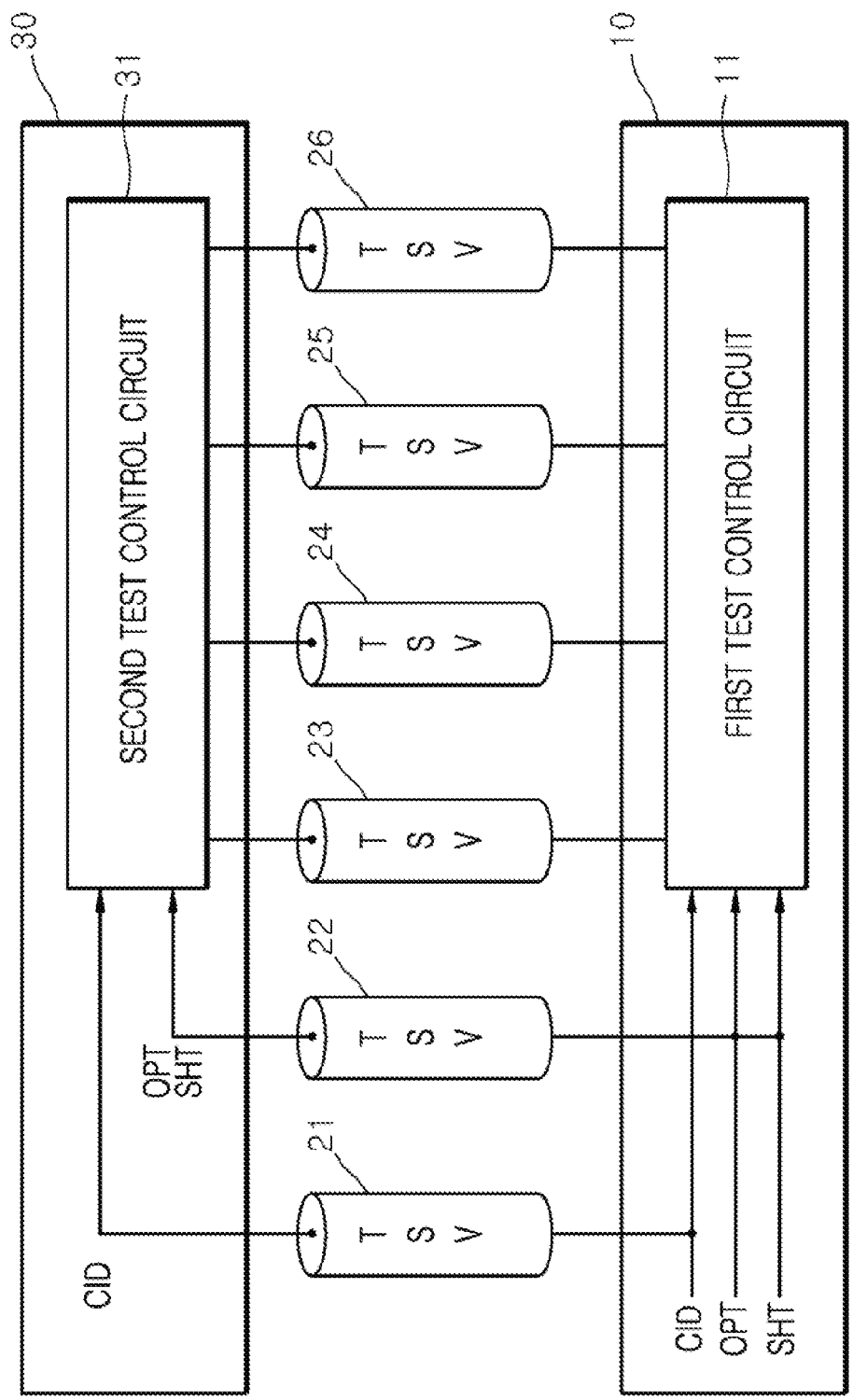
FIG. 1 is a block diagram illustrating a configuration of a semiconductor device according to an embodiment of the present disclosure.

As illustrated in FIG. 1, a semiconductor device 1 according to an embodiment may include a first semiconductor chip 10, first and second transmission through electrodes 21 and 22, first to fourth through electrodes 23, 24, 25 and 26, and a second semiconductor chip 30.

The first semiconductor chip 10 may include a first test control circuit 11.

The first test control circuit 11 may be electrically and physically connected to the first to fourth through electrodes 23~26 when a chip identification signal CID and an open test signal OPT are enabled. The first test control circuit 11 may sequentially test the open failures of the first to fourth through electrodes 23~26 when the chip identification signal CID and the open test signal OPT are enabled. The first test control circuit 11 may be connected to the first to fourth through electrodes 23~26 when the chip identification signal CID and a short test signal SHT are enabled. The first test control circuit 11 may test for a failure between the first and second through electrodes 23 and 24 and for a failure between the third and fourth through electrodes 25 and 26 when the chip identification signal CID and the short test signal SHT are enabled. For example, the first test control circuit 11 may test for a failure between the first and second through electrodes 23 and 24 due to a short occurring between the first and second through electrodes 23 and 24 when the chip identification signal CID and the short test signal SHT are enabled. For example, the first test control circuit 11 may test for a failure between the third and fourth through electrodes 25 and 26 due to a short occurring between the third and fourth through electrodes 25 and 26 when the chip identification signal CID and the short test signal SHT are enabled. The chip identification signal CID may be set as a signal for activating the first and second semiconductor chips 10 and 30. Although FIG. 1 illustrates the chip identification signal CID with a single line, the chip identification signal CID may be a signal including a plurality of bits for selectively activating a plurality of semiconductor chips. The open test signal OPT may be enabled to activate a first test operation. The short test signal SHT may be enabled to activate a second test operation. The first test operation may be an operation for testing the open failures of the first to fourth through electrodes 23~26. In an embodiment, an open failure means that at least one of the first to fourth through electrodes 23~26 is electrically disconnected from at least one of the first and second semiconductor chips 10 and 30. The second test operation may be an operation for testing the short failures between the first to fourth through electrodes 23~26. In an embodiment, a short failure means that at least two adjacent ones among the first to fourth through electrodes 23~26 are electrically connected to each other. The chip identification signal CID may be transmitted from the first semiconductor chip 10 to the second semiconductor chip 30 via the first transmission through electrodes 21. The open test signal OPT and the short test signal SHT may be transmitted from the first semiconductor chip 10 to the second semiconductor chip 30 via the second transmission through electrodes 22.

The first semiconductor chip 10 may sequentially test the open failures of the first to fourth through electrodes 23~26 during the first test operation. The first semiconductor chip 10 may test the short failure between the first and second through electrodes 23 and 24 during the second test operation. The first semiconductor chip 10 may test the short failure between the third and fourth through electrodes 25 and 26 during the second test operation. The first semiconductor chip 10 may test the short failure between the second and third through electrodes 24 and 25 during the second test operation.

The second semiconductor chip 30 may include a second test control circuit 31.

The second test control circuit 31 may be electrically and physically connected to the first to fourth through electrodes 23~26 when the chip identification signal CID and the open test signal OPT are enabled. The second test control circuit 31 may be connected to the first to fourth through electrodes 23~26 when the chip identification signal CID and the short test signal SHT are enabled.

As described above, the second semiconductor chip 30 may be connected to the first to fourth through electrodes 23~26 during the first and second test operations.

The first and second transmission through electrodes 21 and 22 and the first to fourth through electrodes 23~26 may be realized by using general through silicon vias (TSVs) vertically penetrating semiconductor chips. Although FIG. 1 illustrates six through electrodes (i.e., the first and second transmission through electrodes 21 and 22 and the first to fourth through electrodes 23~26), the number of the through electrodes may be set to be less than or greater than six according to the embodiments. In addition, although FIG. 1 illustrates an example in which the semiconductor device 1 includes two semiconductor chips (i.e., the first and second semiconductor chips 10 and 30) which are stacked and connected by the first and second transmission through electrodes 21 and 22 and the first to fourth through electrodes 23~26, the number of the semiconductor chips included in the semiconductor device 1 may be set to be greater than two according to the embodiments.

Figure 2:
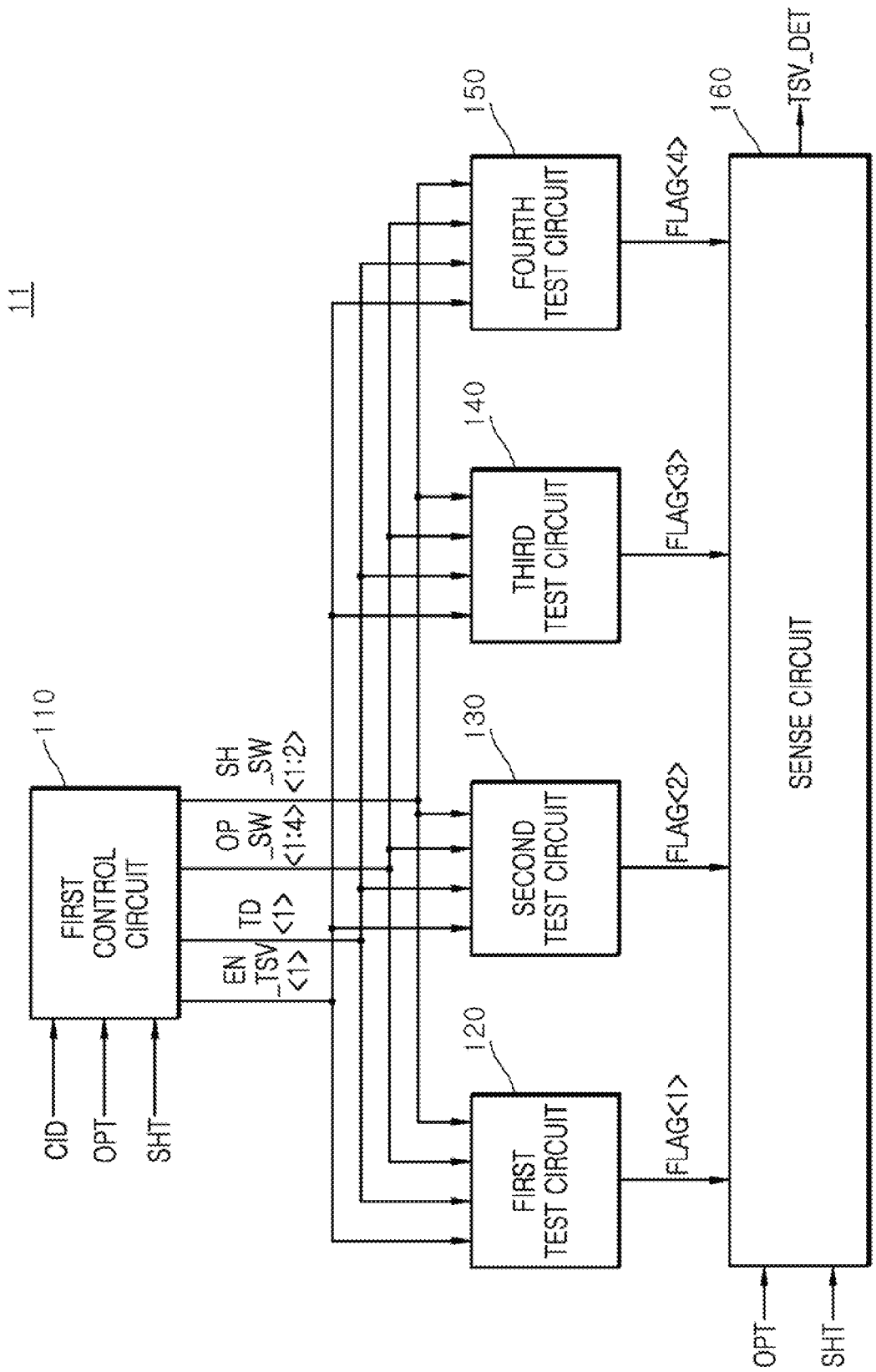
FIG. 2 is a block diagram illustrating a configuration of a first test control circuit included in the semiconductor device of FIG. 1.

Referring to FIG. 2, the first test control circuit 11 may include a first control circuit 110, a first test circuit 120, a second test circuit 130, a third test circuit 140, a fourth test circuit 150, and a sense circuit 160.

The first control circuit 110 may generate a first enablement signal EN_TSV<1> and a first test datum TD<1> when the chip identification signal CID and the open test signal OPT (or the short test signal SHT) are enabled. The first control circuit 110 may generate the first enablement signal EN_TSV<1> which is enabled to have a logic "high" level when the chip identification signal CID is enabled to have a logic "high" level and any one of the open test signal OPT and the short test signal SHT is enabled to have a logic "high" level. The first control circuit 110 may generate the first test datum TD<1> which is enabled to have a logic "low" level when the chip identification signal CID is enabled to have a logic "high" level and any one of the open test signal OPT and the short test signal SHT is enabled to have a logic "high" level.

The first control circuit 110 may generate first to fourth open switch signals OP_SW<1:4> which are sequentially enabled when the chip identification signal CID and the open test signal OPT are enabled. The first control circuit 110 may generate first and second short switch signals SH_SW<1:2> which are enabled when the chip identification signal CID and the short test signal SHT are enabled.

The first test circuit 120 may drive the first through electrode 23 illustrated in FIG. 1 to a predetermined logic level based on the first enablement signal EN_TSV<1> and the first test datum TD<1>. For example, the first test circuit 120 may apply a voltage to the first through electrode 23 to provide a predetermined logic level on the first through electrode 23 based on the first enablement signal EN_TSV<1> and the first test datum TD<1>. The first test circuit 120 may receive the first open switch signal OP_SW<1> and the first short switch signal SH_SW<1> to generate a first flag signal FLAG<1>. The first test circuit 120 may be connected to the first through electrode 23. The predetermined logic level may be set as a logic "high" level or a logic "low" level according to the embodiments. The word "predetermined" as used herein with respect to a parameter, such as a predetermined logic level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The second test circuit 130 may drive the second through electrode 24 illustrated in FIG. 1 to the predetermined logic level based on the first enablement signal EN_TSV<1> and the first test datum TD<1>. The second test circuit 130 may be connected to the second through electrode 24. The second test circuit 130 may receive the second open switch signal OP_SW<2> and the second short switch signal SH_SW<2> to generate a second flag signal FLAG<2>.

The third test circuit 140 may drive the third through electrode 25 illustrated in FIG. 1 to the predetermined logic level based on the first enablement signal EN_TSV<1> and the first test datum TD<1>. The third test circuit 140 may be connected to the third through electrode 25. The third test circuit 140 may receive the third open switch signal OP_SW<3> and the third short switch signal SH_SW<3> to generate a third flag signal FLAG<3>.

The fourth test circuit 150 may drive the fourth through electrode 26 illustrated in FIG. 1 to the predetermined logic level based on the first enablement signal EN_TSV<1> and the first test datum TD<1>. The fourth test circuit 150 may be connected to the fourth through electrode 26. The fourth test circuit 150 may receive the fourth open switch signal OP_SW<4> and the fourth short switch signal SH_SW<4> to generate a fourth flag signal FLAG<4>.

The sense circuit 160 may synthesize the first to fourth flag signals FLAG<1:4> to generate a detection signal TSV_DET when the open test signal OPT or the short test signal SHT is enabled. The detection signal TSV_DET may be enabled when at least one of the first to fourth through electrodes 23~26 has the open failure or the short failure occurs.

Figure 3:
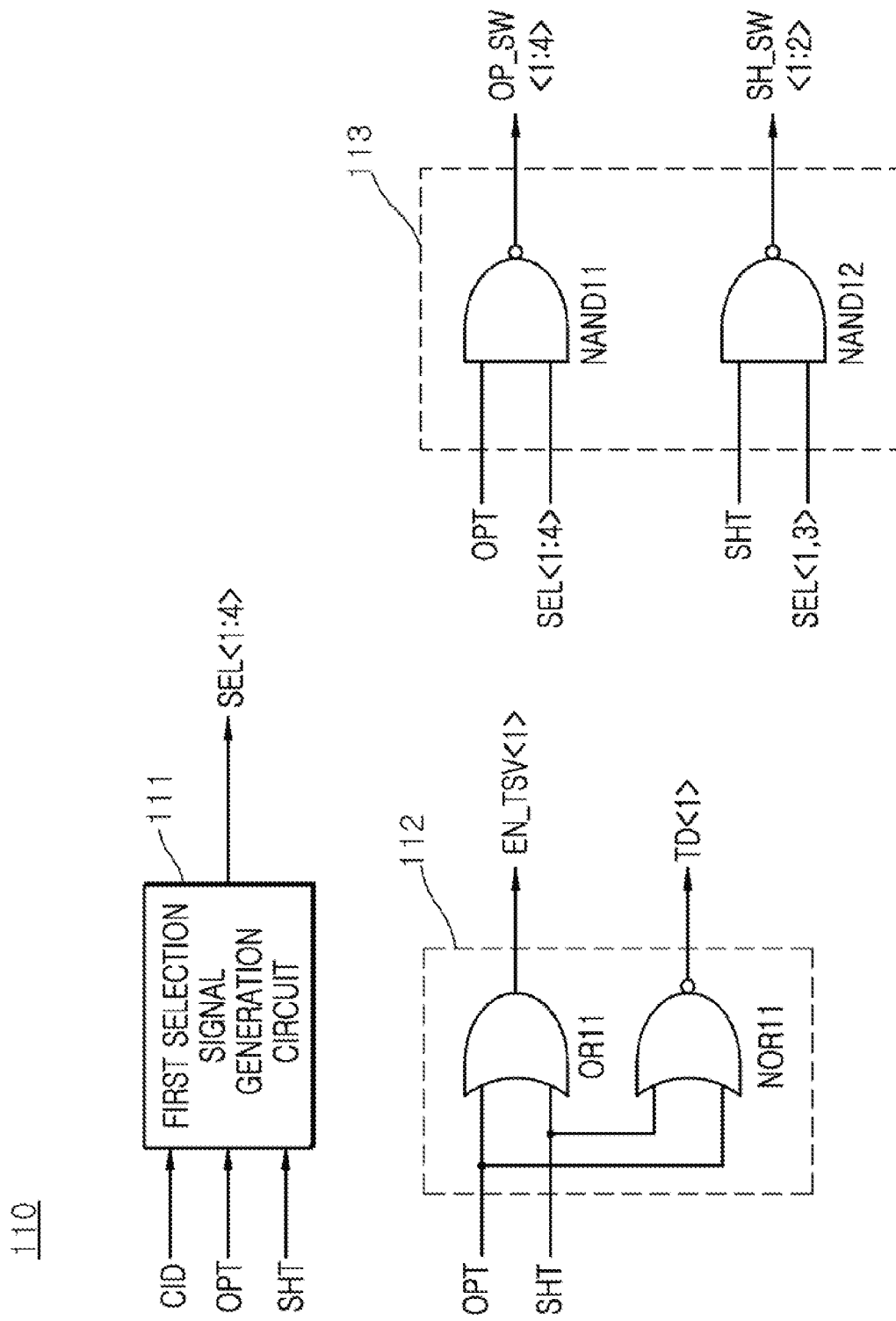
FIG. 3 illustrates a configuration of a first control circuit included in the first test control circuit of FIG. 2.

Referring to FIG. 3, the first control circuit 110 may include a first selection signal generation circuit 111, a logic circuit 112, and a first switch signal generation circuit 113.

The first selection signal generation circuit 111 may generate first to fourth selection signals SEL<1:4> which are sequentially enabled when the chip identification signal CID and the open test signal OPT are enabled. The first selection signal generation circuit 111 may generate the first and third selection signals SEL<1> and SEL<3> which are enabled when the chip identification signal CID and the short test signal SHT are enabled.

The logic circuit 112 may be configured to perform OR and NOR logic operations and may include an OR gate OR11 and a NOR gate NOR11. The logic circuit 112 may generate the first enablement signal EN_TSV<1> which is enabled to have a logic "high" level when any one of the open test signal OPT and the short test signal SHT is enabled to have a logic "high" level. The logic circuit 112 may perform a logical OR operation of the open test signal OPT and the short test signal SHT to generate the first enablement signal EN_TSV<1>. The logic circuit 112 may generate the first test datum TD<1> which is enabled to have a logic "low" level when any one of the open test signal OPT and the short test signal SHT is enabled to have a logic "high" level. The logic circuit 112 may perform a logical NOR operation of the open test signal OPT and the short test signal SHT to generate the first test datum TD<1>.

The first switch signal generation circuit 113 may be configured to perform NAND operations and may be realized using NAND gates NAND11 and NAND12. The first switch signal generation circuit 113 may inversely buffer the first to fourth selection signals SEL<1:4> to generate the first to fourth open switch signals OP_SW<1:4> when the open test signal OPT is enabled to have a logic "high" level. The first switch signal generation circuit 113 may inversely buffer the first to third selection signals SEL<1:3> to generate the first and second short switch signals SH_SW<1:2> when the short test signal SHT is enabled to have a logic "high" level.

Figure 4:
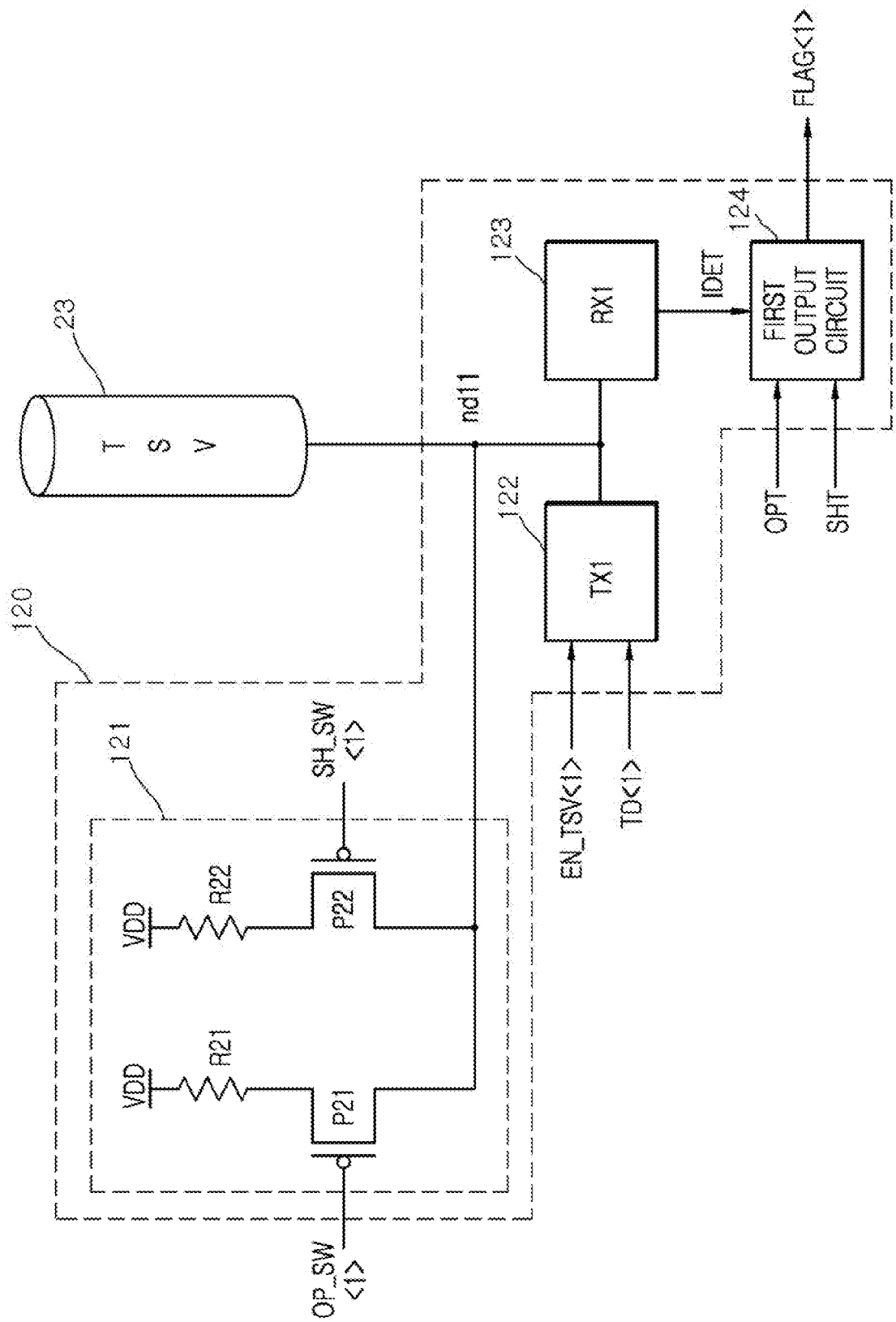
FIG. 4 illustrates a configuration of a first test circuit included in the first test control circuit of FIG. 2 together with a first through electrode shown in FIG. 1.

FIG. 4 illustrates a configuration of the first test circuit 120 included in the first test control circuit 11 of FIG. 2 together with the first through electrode 23 shown in FIG. 1.

Referring to FIG. 4, the first test circuit 120 may include a first resistor connection circuit 121, a first transmitter 122, a first receiver 123, and a first output circuit 124.

The first resistor connection circuit 121 may be coupled between a power supply voltage VDD terminal and a first internal node nd11 connected to the first through electrode 23. The first resistor connection circuit 121 may electrically connect the first through electrode 23 to a first test resistor R21 when the first open switch signal OP_SW<1> is enabled to have a logic "low" level. The first resistor connection circuit 121 may electrically connect the first through electrode 23 to a third test resistor R22 when the first short switch signal SH_SW<1> is enabled to have a logic "low" level.

For example, the first resistor connection circuit 121 may include the first test resistor R21 and a first switch P21 which are coupled in series between the power supply voltage VDD terminal and the first internal node nd11 connected to the first through electrode 23. When the first open switch signal OP_SW<1> is enabled to have a logic "low" level, the first switch P21 may be turned on to electrically connect the first test resistor R21 to the first through electrode 23. The first resistor connection circuit 121 may also include the third test resistor R22 and a second switch P22 which are coupled in series between the power supply voltage VDD terminal and the first internal node nd11 connected to the first through electrode 23. When the first short switch signal SH_SW<1> is enabled to have a logic "low" level, the second switch P22 may be turned on to electrically connect the third test resistor R22 to the first through electrode 23. The first test resistor R21 may be set as a replica resistor having a resistance value corresponding to a resistance value of the first through electrode 23 which is regarded as a normal through electrode without the open failure. In an embodiment, if the open failure of the first through electrode 23 does not occur when the first through electrode 23 has a resistance value of 100 ohms, the resistance value of the first test resistor R21 may be set to be 100 ohms. The resistance value of the first test resistor R21 may be set to be different according to the embodiments. The third test resistor R22 may be set as a replica resistor having a resistance value corresponding to a resistance value between the first and second through electrodes 23 and 24 when no short failure occurs between the first and second through electrodes 23 and 24. In an embodiment, if no short failure between the first and second through electrodes 23 and 24 occurs when a resistance value between the first and second through electrodes 23 and 24 is set to be 100 KΩ, the resistance value of the third test resistor R22 may be set to be 100 KΩ. The resistance value of the third test resistor R22 may be set to be different according to the embodiments.

The first transmitter 122 may drive a level of the first through electrode 23 to a predetermined logic level based on the first enablement signal EN_TSV<1> and the first test datum TD<1>. The first transmitter 122 may drive a level of the first through electrode 23 to the predetermined logic level when the first enablement signal EN_TSV<1> is enabled and the first test datum TD<1> is enabled. The predetermined logic level may be set to be a logic "low" level.

The first receiver 123 may detect a voltage level of the first internal node nd11 to generate a first internal detection signal IDET. The first receiver 123 may buffer a voltage signal of the first internal node nd11 to generate the first internal detection signal IDET.

The first output circuit 124 may generate the first flag signal FLAG<1> from the first internal detection signal IDET when any one of the open test signal OPT and the short test signal SHT is enabled.

Each of the second to fourth test circuits 130, 140, and 150 illustrated in FIG. 2 may be realized to have substantially the same circuit as the first test circuit 120 described with reference to FIG. 4 except input and output signals thereof. Thus, descriptions of the second to fourth test circuits 130, 140, and 150 will be omitted hereinafter. In addition, although the second through electrode 24 is not illustrated in FIG. 4, the second through electrode 24 may be disposed to be adjacent to the first through electrode 23 as illustrated in FIG. 1.

Figure 5:
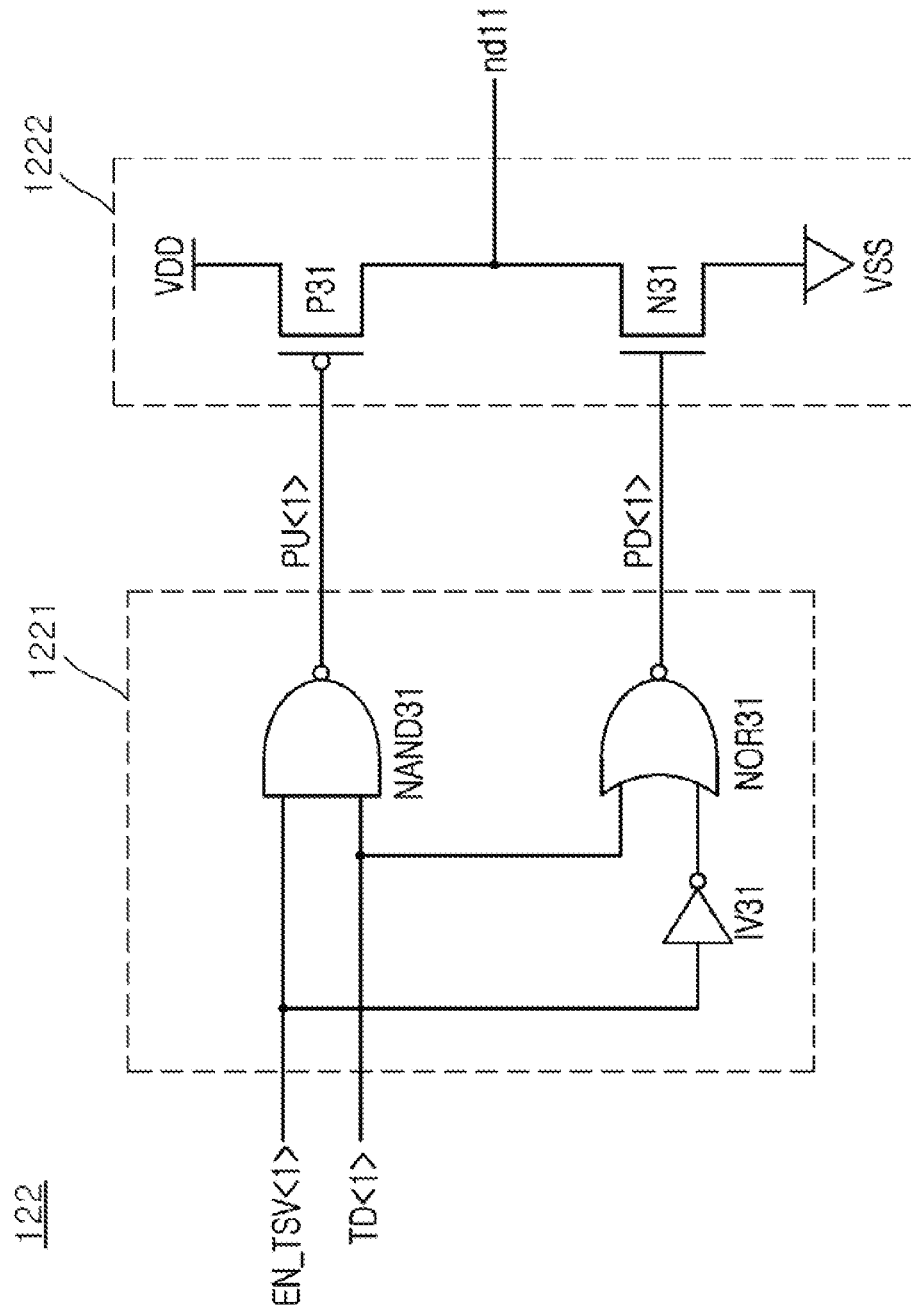
FIG. 5 is a circuit diagram illustrating a configuration of a first transmitter included in the first test circuit of FIG. 4.

Referring to FIG. 5, the first transmitter 122 may include a first pull-up/pull-down signal generation circuit 1221 and a first drive circuit 1222.

The first pull-up/pull-down signal generation circuit 1221 may be in configured to perform inversion, NAND, and NOR operations, and may be realized to include an inverter IV31, a NAND gate NAND31, and a NOR gate NOR31. The first pull-up/pull-down signal generation circuit 1221 may inversely buffer the first test datum TD<1> to generate a first pull-up signal PU<1> when the first enablement signal EN_TSV<1> is enabled to have a logic "high" level. The first pull-up/pull-down signal generation circuit 1221 may inversely buffer the first test datum TD<1> to generate a first pull-down signal PD<1> when the first enablement signal EN_TSV<1> is enabled to have a logic "high" level. The first pull-up/pull-down signal generation circuit 1221 may generate the first pull-up signal PU<1> having a logic "high" level and the first pull-down signal PD<1> having a logic "high" level when the first enablement signal EN_TSV<1> is enabled to have a logic "high" level and the first test datum TD<1> is enabled to have a logic "low" level.

The first drive circuit 1222 may be realized to include a PMOS transistor P31 coupled between the power supply voltage VDD terminal and the first internal node nd11 connected to the first through electrode 23 and an NMOS transistor N31 coupled between the first internal node nd11 and a ground voltage VSS terminal. The first drive circuit 1222 may pull up a level of the first internal node nd11 to the power supply voltage VDD when the first pull-up signal PU<1> has a logic "low" level. The first drive circuit 1222 may pull down a level of the first internal node nd11 to the ground voltage VSS when the first pull-down signal PD<1> has a logic "high" level.

Figure 6:
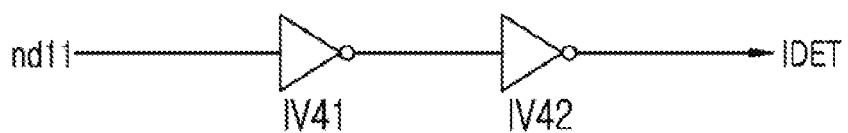
FIG. 6 is a circuit diagram illustrating a configuration of a first receiver included in the first test circuit of FIG. 4.

Referring to FIG. 6, the first receiver 123 may be configured to perform an inversion operation and may be realized to include inverters IV41 and IV42 which are connected in series.

The first receiver 123 may buffer a voltage signal of the first internal node nd11 to generate the first internal detection signal IDET.

Figure 7:
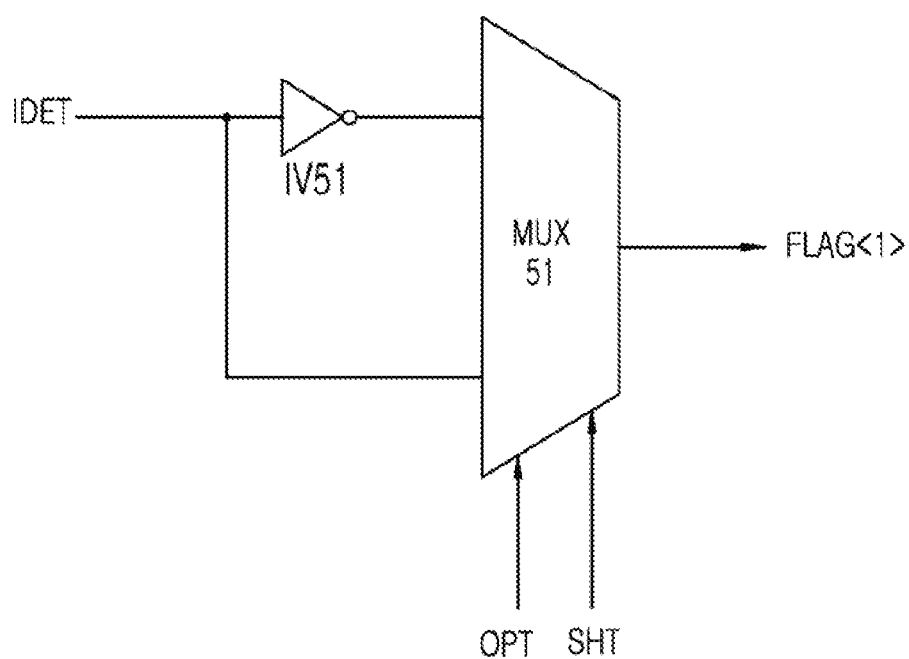
FIG. 7 is a circuit diagram illustrating a configuration of a first output circuit included in the first test circuit of FIG. 4.

Referring to FIG. 7, the first output circuit 124 may be realized to include an inverter IV51 and a multiplexer MUX51.

The first output circuit 124 may inversely buffer the first internal detection signal IDET to output the inversely buffered signal of the first internal detection signal IDET as the first flag signal FLAG<1> when the open test signal OPT is enabled. The first output circuit 124 may buffer the first internal detection signal IDET to output the buffered signal of the first internal detection signal IDET as the first flag signal FLAG<1> when the short test signal SHT is enabled.

Figure 8:
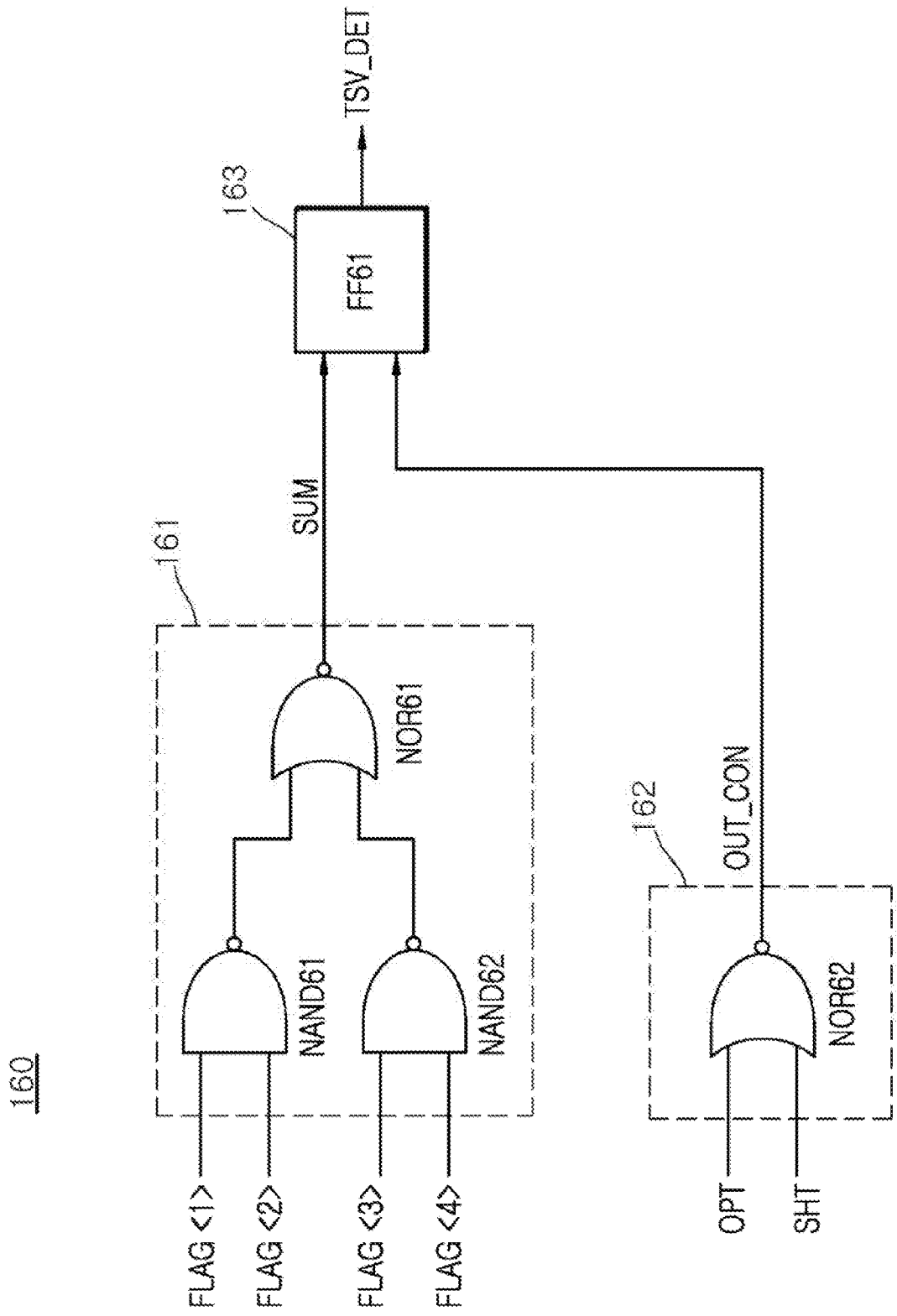
FIG. 8 illustrates a configuration of a sense circuit included in the first test control circuit of FIG. 2.

Referring to FIG. 8, the sense circuit 160 may include a synthesis signal generation circuit 161, an output control signal generation circuit 162, and a detection signal generation circuit 163.

The synthesis signal generation circuit 161 may be configured to perform NAND and NOR operations and may be realized to include NAND gates NAND61 and NAND62 and a NOR gate NOR61. The synthesis signal generation circuit 161 may generate a synthesis signal SUM having a logic "high" level when all of the first to fourth flag signals FLAG<1:4> have a logic "high" level. The synthesis signal generation circuit 161 may generate the synthesis signal SUM having a logic "low" level when at least one of the first to fourth flag signals FLAG<1:4> has a logic "low" level.

The output control signal generation circuit 162 may be configured to perform a NOR operation and may be realized using a NOR gate NOR62. The output control signal generation circuit 162 may generate an output control signal OUT_CON having a logic "high" level when both of the open test signal OPT and the short test signal SHT are disabled to have a logic "low" level. The output control signal generation circuit 162 may generate the output control signal OUT_CON having a logic "low" level when any one of the open test signal OPT and the short test signal SHT is enabled to have a logic "high" level.

The detection signal generation circuit 163 may be realized using a flip-flop FF61. The detection signal generation circuit 163 may output the synthesis signal SUM as the detection signal TSV_DET when the output control signal OUT_CON is enabled to have a logic "high" level.

Figure 9:
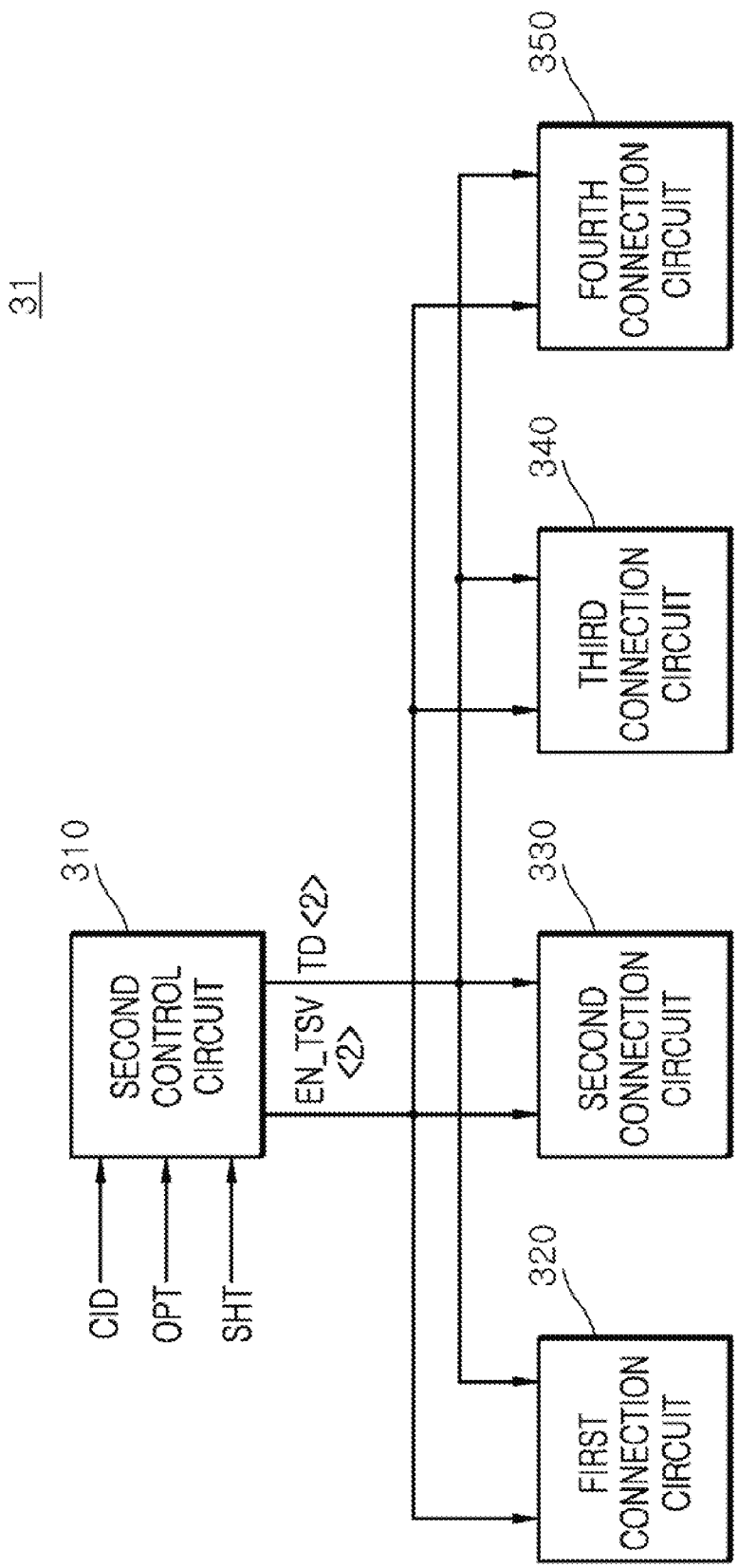
FIG. 9 is a block diagram illustrating a configuration of a second test control circuit included in the semiconductor device of FIG. 1.

Referring to FIG. 9, the second test control circuit 31 may include a second control circuit 310, a first connection circuit 320, a second connection circuit 330, a third connection circuit 340, and a fourth connection circuit 350.

The second control circuit 310 may generate a second enablement signal EN_TSV<2> and a second test datum TD<2> when the chip identification signal CID is enabled and any one of the open test signal OPT and the short test signal SHT is enabled.

The first connection circuit 320 may drive a level of the first through electrode 23 illustrated in FIG. 1 to the predetermined logic level based on the second enablement signal EN_TSV<2> and the second test datum TD<2>.

The second connection circuit 330 may drive a level of the second through electrode 24 illustrated in FIG. 1 to the predetermined logic level based on the second enablement signal EN_TSV<2> and the second test datum TD<2>.

The third connection circuit 340 may drive a level of the third through electrode 25 illustrated in FIG. 1 to the predetermined logic level based on the second enablement signal EN_TSV<2> and the second test datum TD<2>.

The fourth connection circuit 350 may drive a level of the fourth through electrode 26 illustrated in FIG. 1 to the predetermined logic level based on the second enablement signal EN_TSV<2> and the second test datum TD<2>.

Figure 10:
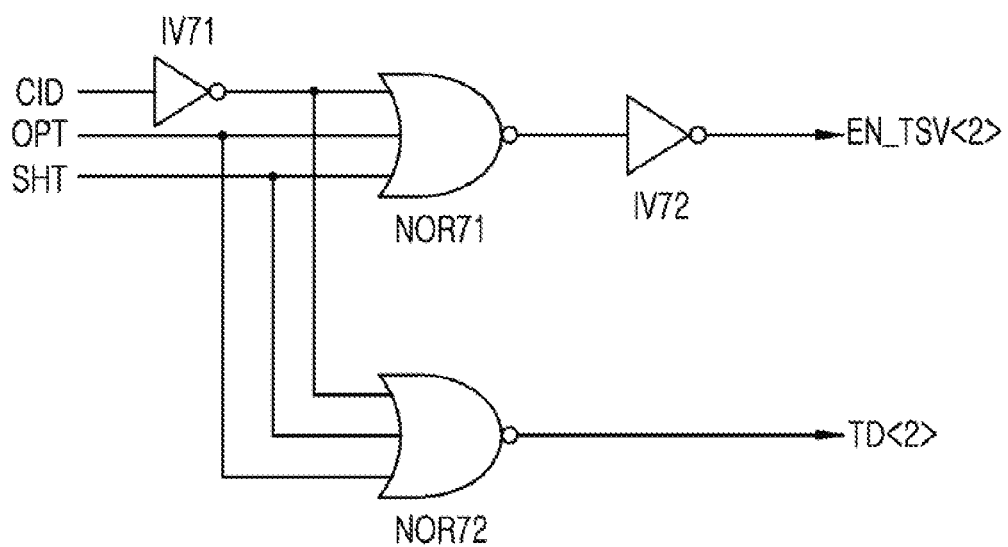
FIG. 10 is a circuit diagram illustrating a configuration of a second control circuit included in the second test control circuit of FIG. 9.

Referring to FIG. 10, the second control circuit 310 may be configured to perform inversion and NOR operations and may be realized to include inverters IV71 and IV72 and NOR gates NOR71 and NOR72.

The second control circuit 310 may generate the second enablement signal EN_TSV<2> and the second test datum TD<2> based on the chip identification signal CID, the open test signal OPT, and the short test signal SHT. The second control circuit 310 may generate the second enablement signal EN_TSV<2> which is enabled to have a logic "high" level when the chip identification signal CID is enabled to have a logic "high" level and any one of the open test signal OPT and the short test signal SHT is enabled to have a logic "high" level. The second control circuit 310 may generate the second test datum TD<2> which is enabled to have a logic "low" level when the chip identification signal CID is enabled to have a logic "high" level and any one of the open test signal OPT and the short test signal SHT is enabled to have a logic "high" level.

Figure 11:
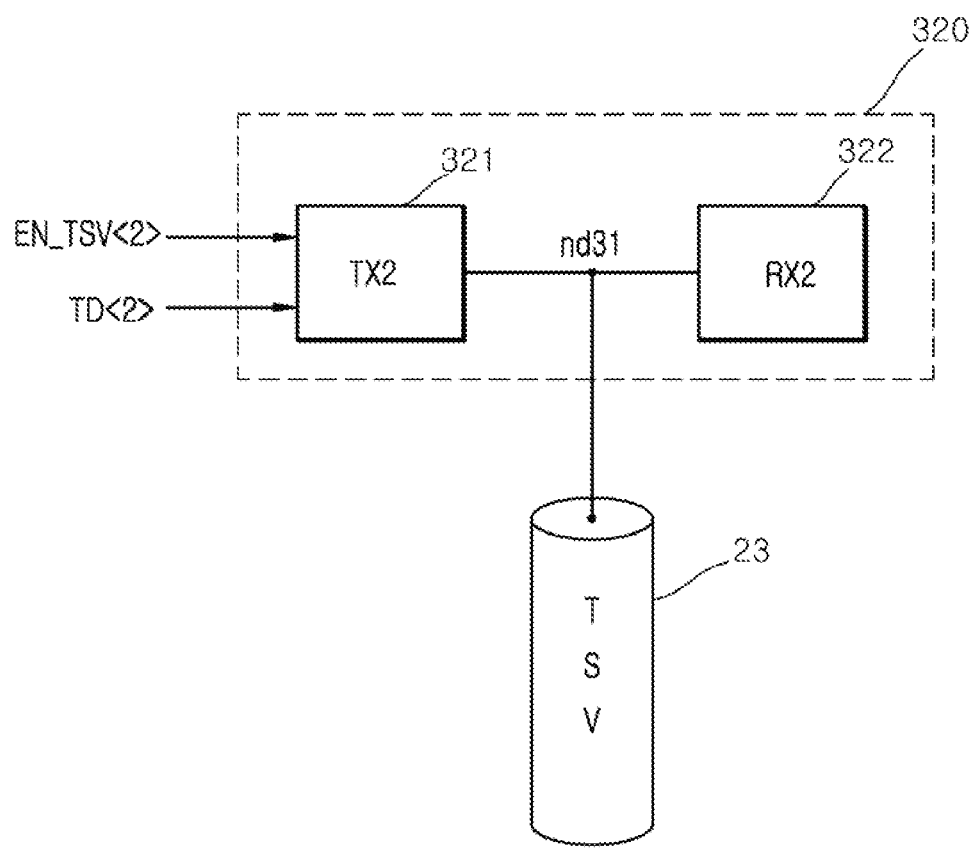
FIG. 11 illustrates a configuration of a first connection circuit included in the second test control circuit of FIG. 9 together with a first through electrode shown in FIG. 1.

FIG. 11 illustrates a configuration of the first connection circuit 320 included in the second test control circuit 31 of FIG. 9 together with the first through electrode 23 shown in FIG. 1.

Referring to FIG. 11, the first connection circuit 320 may include a second transmitter 321 and a second receiver 322.

The second transmitter 321 may drive a third internal node nd31 connected to the first through electrode 23 to the predetermined logic level based on the second enablement signal EN_TSV<2> and the second test datum TD<2>.

The second receiver 322 may receive and output a signal of the third internal node nd31. The second receiver 322 may receive a signal via the first through electrode 23 and may output the signal. The second receiver 322 may be realized using a general receiver.

Each of the second to fourth connection circuits 330, 340 and 350 illustrated in FIG. 9 may be realized to have substantially the same circuit as the first connection circuit 320 described with reference to FIG. 11 except input and output signals thereof. Thus, descriptions of the second to fourth connection circuits 330, 340 and 350 will be omitted hereinafter.

Figure 12:
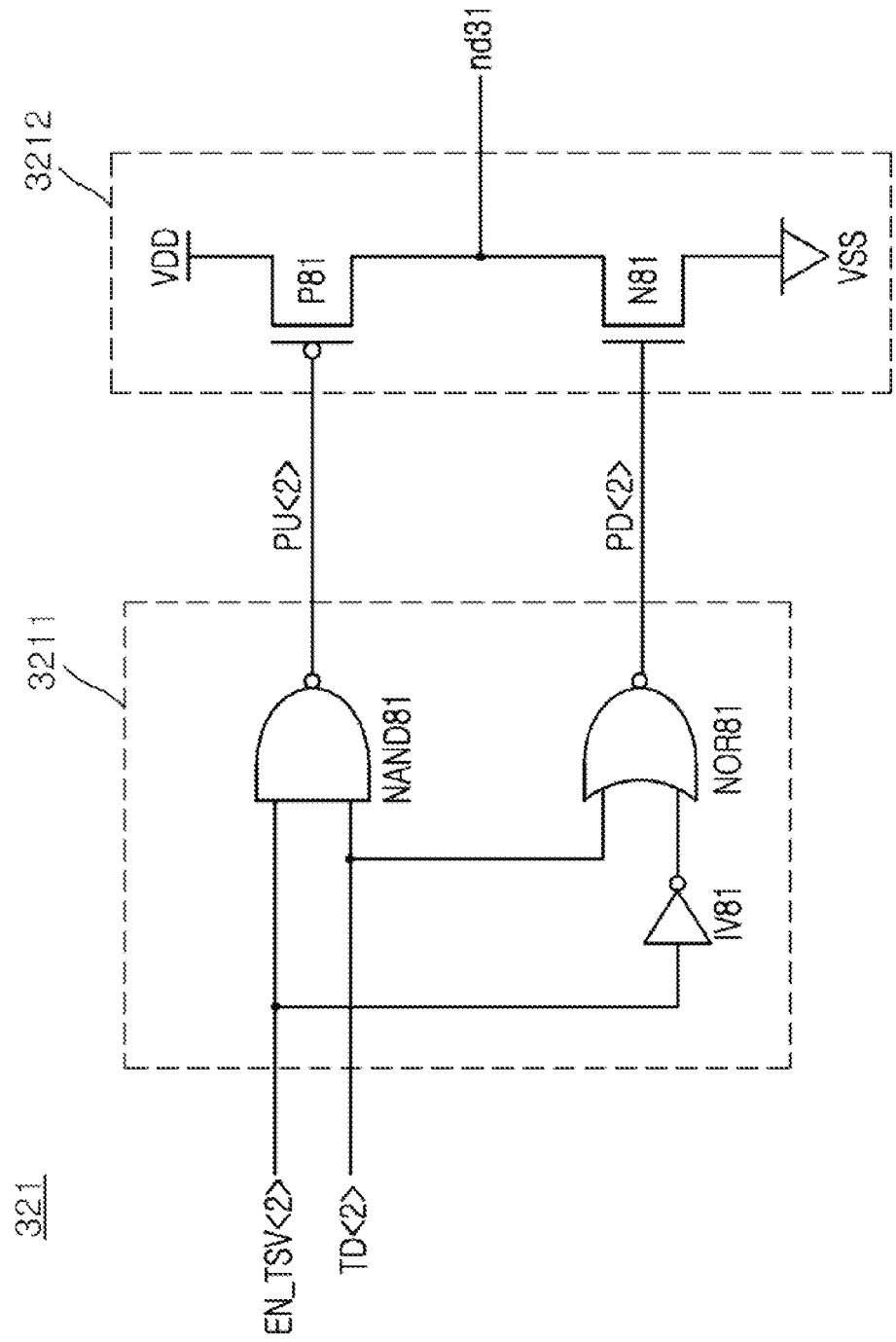
FIG. 12 is a circuit diagram illustrating a configuration of a second transmitter included in the first connection circuit of FIG. 11.

Referring to FIG. 12, the second transmitter 321 may include a second pull-up/pull-down signal generation circuit 3211 and a second drive circuit 3212.

The second pull-up/pull-down signal generation circuit 3211 may be configured to perform inversion, NAND, and NOR operations, and may be realized to include an inverter IV81, a NAND gate NAND81, and a NOR gate NOR81. The second pull-up/pull-down signal generation circuit 3211 may inversely buffer the second test datum TD<2> to generate a second pull-up signal PU<2> when the second enablement signal EN_TSV<2> is enabled to have a logic "high" level. The second pull-up/pull-down signal generation circuit 3211 may inversely buffer the second test datum TD<2> to generate a second pull-down signal PD<2> when the second enablement signal EN_TSV<2> is enabled to have a logic "high" level. The second pull-up/pull-down signal generation circuit 3211 may generate the second pull-up signal PU<2> having a logic "high" level and the second pull-down signal PD<2> having a logic "high" level when the second enablement signal EN_TSV<2> is enabled to have a logic "high" level and the second test datum TD<2> is enabled to have a logic "low" level.

The second drive circuit 3212 may be realized to include a PMOS transistor P81 coupled between the power supply voltage VDD terminal and the third internal node nd31 connected to the first through electrode 23 and an NMOS transistor N81 coupled between the third internal node nd31 and the ground voltage VSS terminal. The second drive circuit 3212 may pull up a level of the third internal node nd31 to the power supply voltage VDD when the second pull-up signal PU<2> has a logic "low" level. The second drive circuit 3212 may pull down a level of the third internal node nd31 to the ground voltage VSS when the second pull-down signal PD<2> has a logic "high" level.

Figure 13:
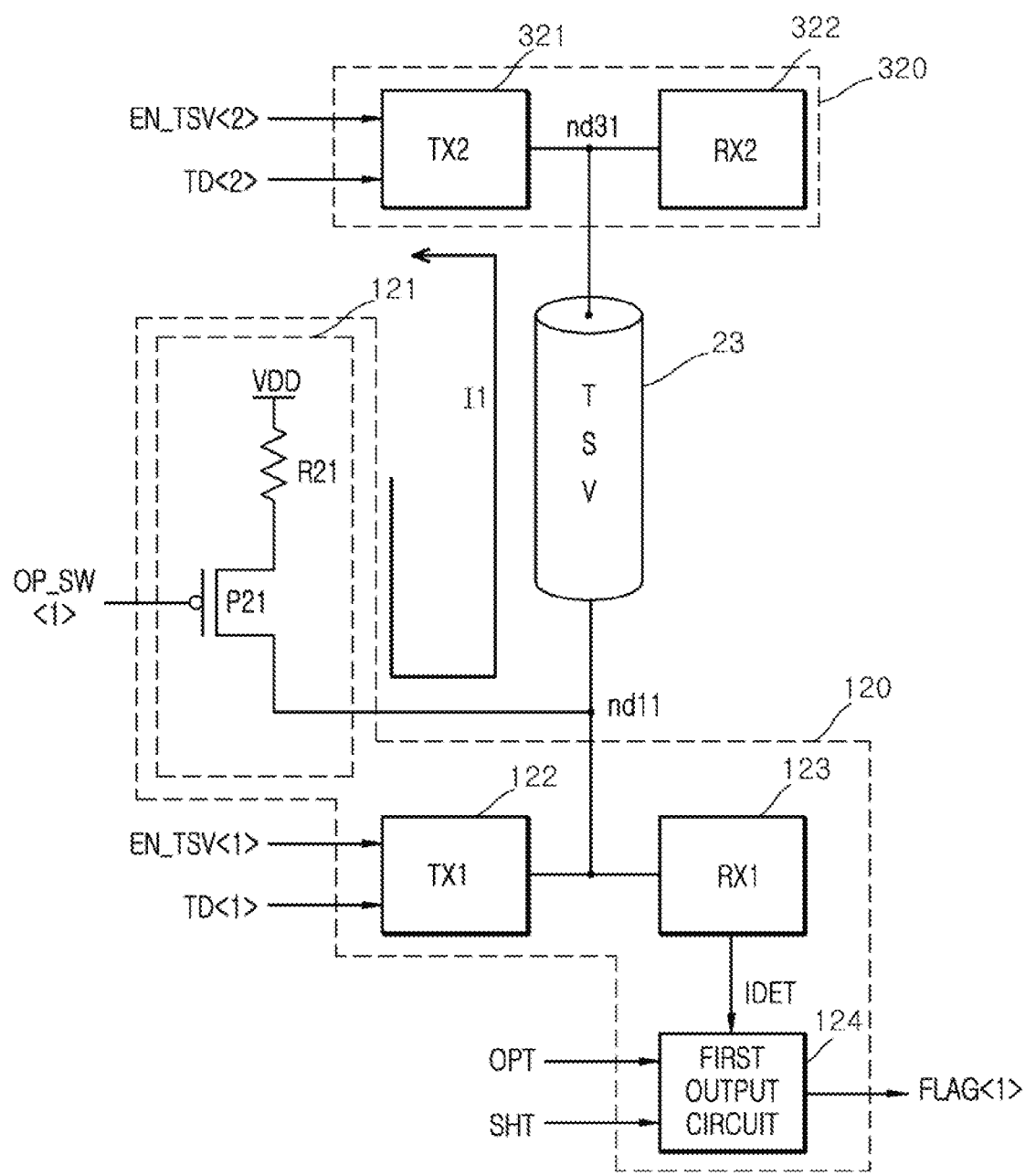
FIGS. 13 and 14 illustrate a first test operation of a semiconductor device according to an embodiment of the present disclosure.
Figure 14:
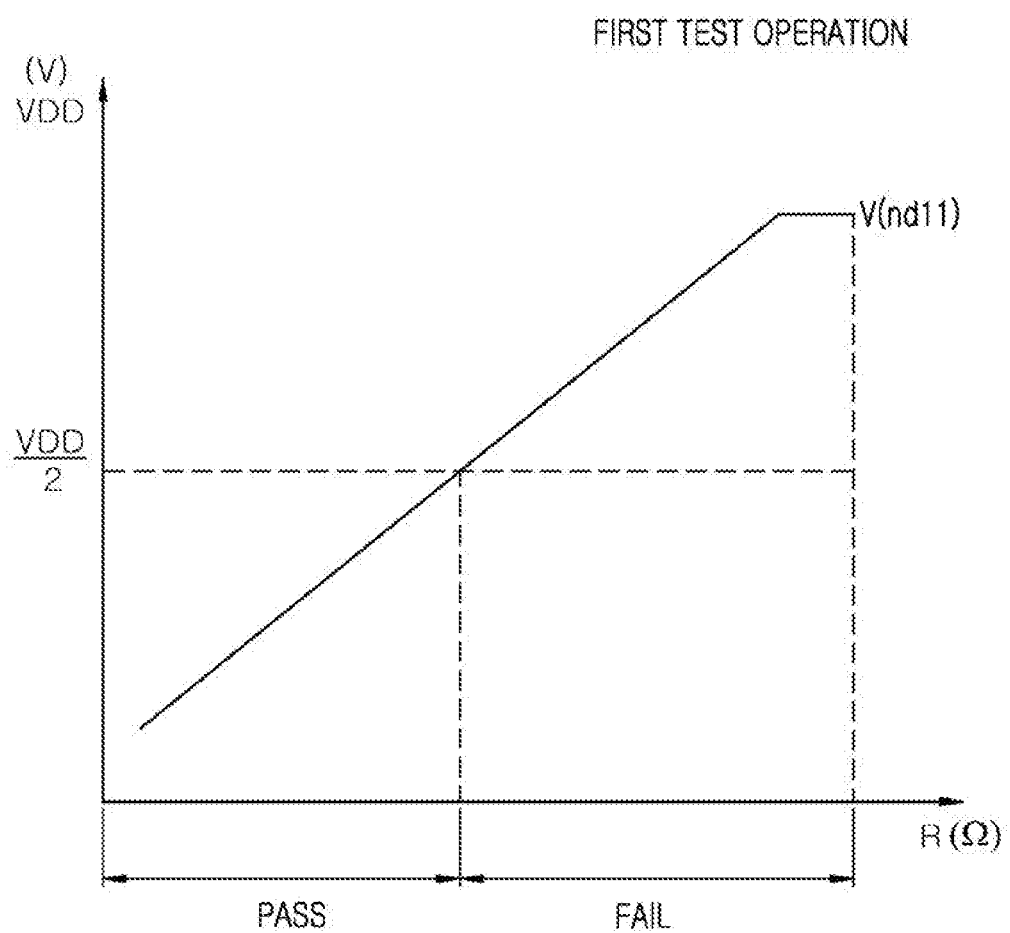

FIGS. 13 and 14 illustrate the first test operation of a semiconductor device according to an embodiment of the present disclosure.

Operations of the first test circuit 120 and the first connection circuit 320, which are connected to the first through electrode 23 during the first test operation, will be described hereinafter with reference to FIG. 13.

As described with reference to FIG. 2, the first control circuit 110 may generate the first enablement signal EN_TSV<1> having a logic "high" level and the first test datum TD<1> having a logic "low" level when the chip identification signal CID and the open test signal OPT are enabled. The first control circuit 110 may generate the first open switch signal OP_SW<1> which is enabled to have a logic "low" level when the chip identification signal CID and the open test signal OPT are enabled.

As described with reference to FIG. 9, the second control circuit 310 may generate the second enablement signal EN_TSV<2> having a logic "high" level and the second test datum TD<2> having a logic "low" level when the chip identification signal CID and the open test signal OPT are enabled.

In the first resistor connection circuit 121, when the first open switch signal OP_SW<1> is enabled to have a logic "low" level, the first switch P21 may be turned on to electrically connect the first test resistor R21 to the first internal node nd11 connected to the first through electrode 23.

The first transmitter 122 may drive a level of the first through electrode 23 to a logic "low" level based on the first enablement signal EN_TSV<1> having a logic "high" level and the first test datum TD<1> having a logic "low" level.

The second transmitter 321 may electrically connect the third internal node nd31 connected to the first through electrode 23 to the ground voltage VSS terminal based on the second enablement signal EN_TSV<2> having a logic "high" level and the second test datum TD<2> having a logic "low" level. In such a case, a first current path I1 may be provided between the power supply voltage VDD terminal and the ground voltage VSS terminal, and the power supply voltage VDD may be divided by the first current path I1 such that a voltage level of the first internal node nd11 is determined. Although the ground voltage VSS terminal is not illustrated in FIG. 13, the ground voltage VSS terminal of the second transmitter 321 may correspond to the ground voltage VSS terminal illustrated in FIG. 12.

The first receiver 123 may detect a voltage level of the first internal node nd11 to generate the first internal detection signal IDET.

The first output circuit 124 may generate the first flag signal FLAG<1> from the first internal detection signal IDET because the open test signal OPT is enabled.

A voltage level of the first internal node nd11 for testing the open failure of the first through electrode 23 during the first test operation will be described hereinafter with reference to a graph of FIG. 14. In the graph of FIG. 14, the abscissa denotes a resistance value R of the first through electrode 23, and the ordinate denotes a voltage level of the first internal node nd11.

As described above, when a voltage level "V(nd11)" of the first internal node nd11 determined by the first current path I1 between the power supply voltage VDD terminal and the ground voltage VSS terminal is lower than half of the power supply voltage VDD, the first through electrode 23 may be regarded as a normal through electrode (PASS) without open failure.

In an embodiment, if the first through electrode 23 is regarded as a normal through electrode (PASS) without open failure, the first through electrode 23 may have a resistance value which is less than 100 ohms when the first test resistor R21 has a resistance value of 100 ohms. Thus, a voltage level "V(nd11)" of the first internal node nd11 may be lower than half of the power supply voltage VDD. In an embodiment, the resistance value of the first test resistor R21 may be set to correspond to a resistance value of the first through electrode 23 which is regarded as a normal through electrode without the open failure.

In contrast, when the voltage level "V(nd11)" of the first internal node nd11 determined by the first current path I1 between the power supply voltage VDD terminal and the ground voltage VSS terminal is higher than half of the power supply voltage VDD, the first through electrode 23 may be regarded as an abnormal through electrode (FAIL) with open failure.

In an embodiment, if the first through electrode 23 is regarded as an abnormal through electrode (PASS) with open failure, the first through electrode 23 may have a resistance value which is greater than 100 ohms when the first test resistor R21 has a resistance value of 100 ohms. Thus, the voltage level "V(nd11)" of the first internal node nd11 may be higher than half of the power supply voltage VDD.

Figure 15:
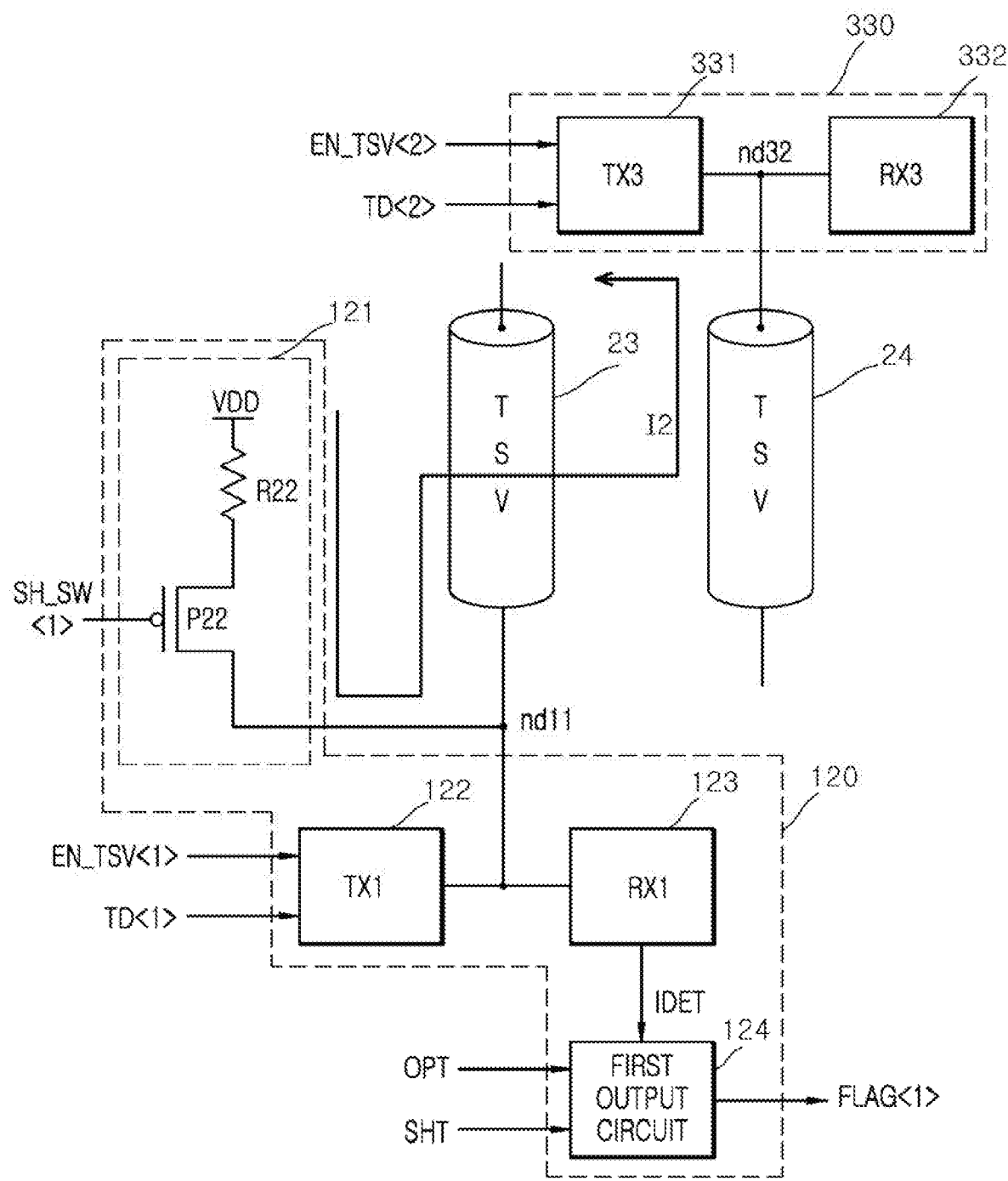
FIGS. 15 and 16 illustrate a second test operation of a semiconductor device according to an embodiment of the present disclosure.

Operations of the first test circuit 120 and the second connection circuit 330, which are connected to respective ones of the first and second through electrodes 23 and 24 during the second test operation, will be described hereinafter with reference to FIG. 15.

As described with reference to FIG. 2, the first control circuit 110 may generate the first enablement signal EN_TSV<1> having a logic "high" level and the first test datum TD<1> having a logic "low" level when the chip identification signal CID and the short test signal SHT are enabled. The first control circuit 110 may generate the first short switch signal SH_SW<1> which is enabled to have a logic "low" level when the chip identification signal CID and the short test signal SHT are enabled.

As described with reference to FIG. 9, the second control circuit 310 may generate the second enablement signal EN_TSV<2> having a logic "high" level and the second test datum TD<2> having a logic "low" level when the chip identification signal CID and the short test signal SHT are enabled.

In the first resistor connection circuit 121, when the first short switch signal SH_SW<1> is enabled to have a logic "low" level, the second switch P22 may be turned on to electrically connect the third test resistor R22 to the first internal node nd11 connected to the first through electrode 23.

The first transmitter 122 may drive a level of the first through electrode 23 to a logic "low" level based on the first enablement signal EN_TSV<1> having a logic "high" level and the first test datum TD<1> having a logic "low" level.

A third transmitter 331 of the second connection circuit 330 may electrically connect a fourth internal node nd32 connected to the second through electrode 24 to the ground voltage VSS terminal based on the second enablement signal EN_TSV<2> having a logic "high" level and the second test datum TD<2> having a logic "low" level. In such a case, a second current path I2 may be provided between the power supply voltage VDD terminal and the ground voltage VSS terminal, and the power supply voltage VDD may be divided by the second current path I2 such that a voltage level of the first internal node nd11 is determined. Although the ground voltage VSS terminal is not illustrated in FIG. 15, the ground voltage VSS terminal of the third transmitter 331 may correspond to the ground voltage VSS terminal illustrated in FIG. 12.

The first receiver 123 may detect a voltage level of the first internal node nd11 to generate the first internal detection signal IDET.

The first output circuit 124 may generate the first flag signal FLAG<1> from the first internal detection signal IDET because the short test signal SHT is enabled.

Figure 16:
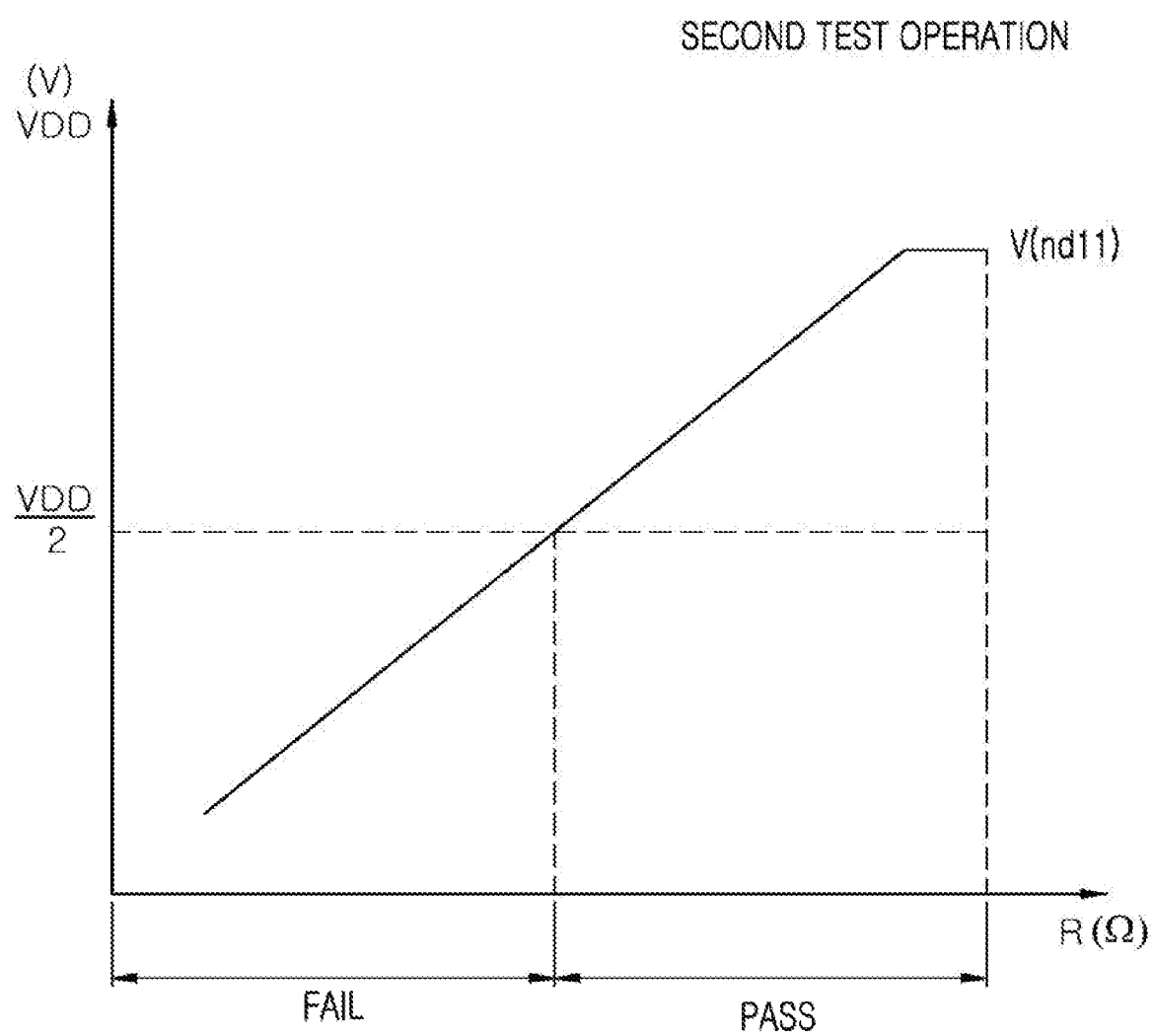

A voltage level of the first internal node nd11 for testing the short failure between the first and second through electrodes 23 and 24 during the second test operation will be described hereinafter with reference to a graph of FIG. 16. In the graph of FIG. 16, the abscissa denotes a resistance value R between the first and second through electrodes 23 and 24, and the ordinate denotes a voltage level of the first internal node nd11.

As described above, when the voltage level "V(nd11)" of the first internal node nd11 determined by the second current path I2 between the power supply voltage VDD terminal and the ground voltage VSS terminal is lower than half of the power supply voltage VDD, the second current path I2 may be regarded as an abnormal current path (FAIL) having short failure which is due to a leakage current path between the first and second through electrodes 23 and 24.

In an embodiment, if the second current path I2 is regarded as the abnormal current path (FAIL) having short failure, a resistance value between the first and second through electrodes 23 and 24 may be equal to or less than 100 ohms when the third test resistor R22 has a resistance value of 100 ohms. Thus, the voltage level "V(nd11)" of the first internal node nd11 may be lower than half of the power supply voltage VDD. In an embodiment, the resistance value of the third test resistor R22 may be set to correspond to a resistance value between the first and second through electrodes 23 and 24 when no short failure occurs between the first and second through electrodes 23 and 24. In some embodiments, the third test resistor R22 has a greater resistance value than the first test resistor R21.

In contrast, when the voltage level "V(nd11)" of the first internal node nd11 determined by the second current path 12 between the power supply voltage VDD terminal and the ground voltage VSS terminal is higher than half of the power supply voltage VDD, the second current path 2 may be regarded as a normal current path (PASS) without short failure between the first and second through electrodes 23 and 24.

In an embodiment, if the second current path 12 is regarded as a normal current path (PASS) without short failure, a resistance value between the first and second through electrodes 23 and 24 may be greater than 100 ohms when the third test resistor R22 has a resistance value of 100 ohms. Thus, the voltage level "V(nd11)" of the first internal node nd11 may be higher than half of the power supply voltage VDD.

Figure 17:
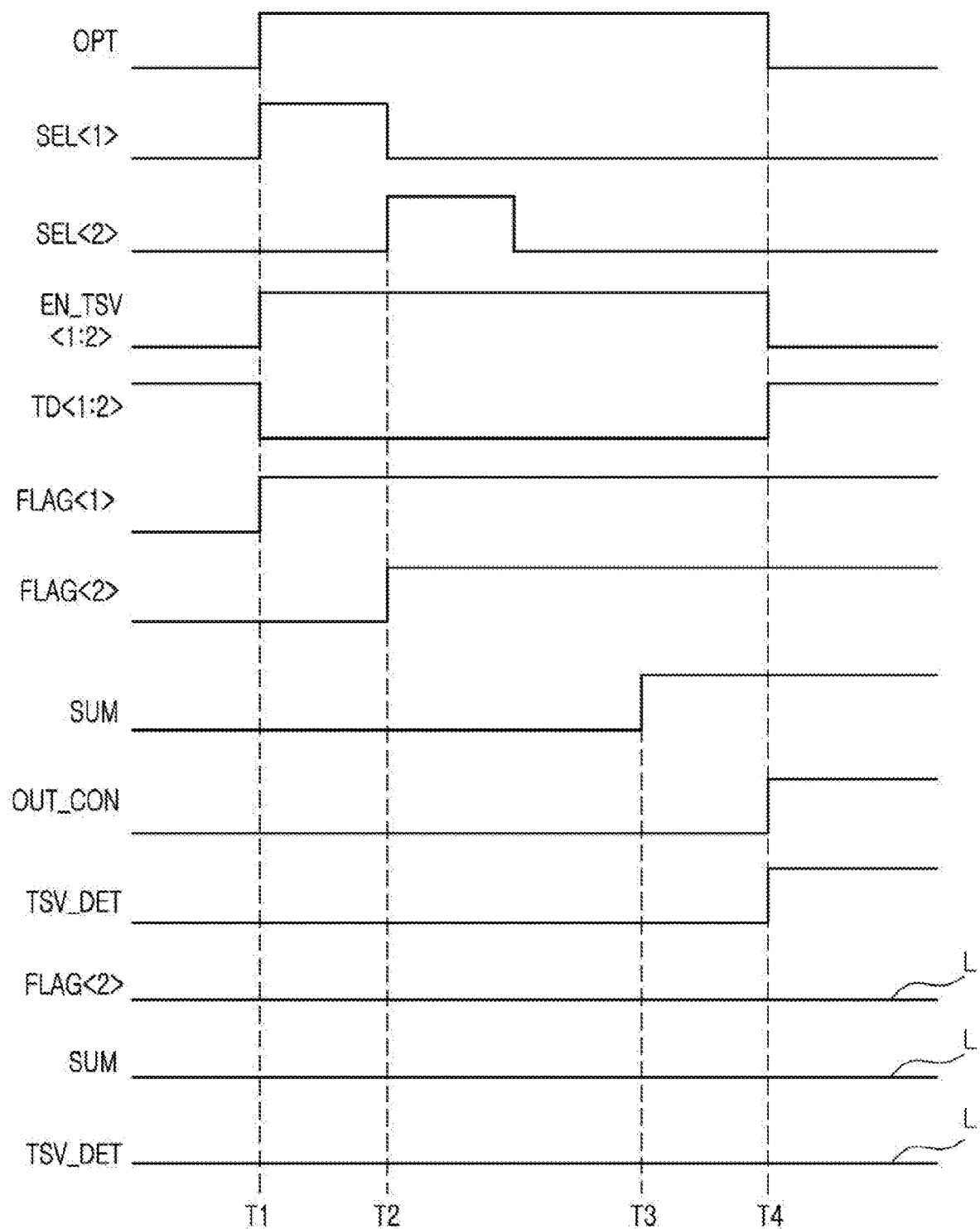
FIGS. 17 and 18 are timing diagrams illustrating a first test operation and a second test operation of a semiconductor device according to an embodiment of the present disclosure.

The first test operation according to an embodiment will be described hereinafter with reference to FIG. 17 in conjunction with an example in which all of the first to fourth through electrodes 23~26 have no open failure and an example in which the second through electrode 24 has the open failure.

First, the example in which all of the first to fourth through electrodes 23~26 have no open failure will be described hereinafter.

At a point in time "T1", the open test signal OPT may be enabled to have a logic "high" level for execution of the first test operation.

The first control circuit 110 may receive the chip identification signal CID and the open test signal OPT to generate the first selection signal SEL<1> enabled to have a logic "high" level, the first enablement signal EN_TSV<1> enabled to have a logic "high" level, and the first test datum TD<1> having a logic "low" level. The first control circuit 110 may receive the chip identification signal CID and the open test signal OPT to generate the first open switch signal OP_SW<1> which is enabled to have a logic "low" level.

The second control circuit 310 may receive the chip identification signal CID and the open test signal OPT to generate the second enablement signal EN_TSV<2> enabled to have a logic "high" level and the second test datum TD<2> having a logic "low" level.

The first test circuit 120 may drive a level of the first through electrode 23 to a logic "low" level based on the first enablement signal EN_TSV<1> and the first test datum TD<1>. The first test circuit 120 may electrically connect the first test resistor R21 to the first through electrode 23 in response to the first open switch signal OP_SW<1>.

The first connection circuit 320 may electrically connect the first through electrode 23 to the ground voltage VSS terminal based on the second enablement signal EN_TSV<2> and the second test datum TD<2>.

The first test circuit 120 may detect a voltage level of the first internal node nd11 to generate the first flag signal FLAG<1> having a logic "high" level.

At a point in time "T2", the first control circuit 110 may receive the chip identification signal CID and the open test signal OPT to generate the second selection signal SEL<2> enabled to have a logic "high" level, the first enablement signal EN_TSV<1> enabled to have a logic "high" level, and the first test datum TD<1> having a logic "low" level. The first control circuit 110 may receive the chip identification signal CID and the open test signal OPT to generate the second open switch signal OP_SW<2> which is enabled to have a logic "low" level.

The second test circuit 130 may drive a level of the second through electrode 24 to a logic "low" level based on the first enablement signal EN_TSV<1> and the first test datum TD<1>. The second test circuit 130 may electrically connect the second test resistor (not shown) to the second through electrode 24 in response to the second open switch signal OP_SW<2>.

The second connection circuit 330 may electrically connect the second through electrode 24 to the ground voltage VSS terminal based on the second enablement signal EN_TSV<2> and the second test datum TD<2>.

The second test circuit 130 may detect a voltage level of a second internal node (not shown) to generate the second flag signal FLAG<2> having a logic "high" level.

The first test operation for the third through electrode 25 may be the same as the above mentioned operation performed at the first point in time "T1", and the first test operation for the fourth through electrode 26 may be the same as the above mentioned operation performed at the second point in time "T2". Thus, the first test operations for the third and fourth through electrodes 25 and 26 will be omitted hereinafter.

At a point in time "T3", the synthesis signal generation circuit 161 may synthesize the first to fourth flag signals FLAG<1:4> to generate the synthesis signal SUM having a logic "high" level.

At a point in time "T4", the output control signal generation circuit 162 may generate the output control signal OUT_CON having a logic "high" level because the open test signal OPT is disabled to have a logic "low" level.

The detection signal generation circuit 163 may generate the detection signal TSV_DET having a logic "high" level from the synthesis signal SUM because the output control signal OUT_CON is enabled to have a logic "high" level.

According to the above description, the detection signal TSV_DET may be generated to have a logic "high" level when all of the first to fourth through electrodes 23~26 have no open failure. Thus, the semiconductor device 1 may regard the first to fourth through electrodes 23~26 as normal through electrodes without any open failure.

Next, the example in which the second through electrode 24 has the open failure will be described hereinafter.

At the point in time "T1", the open test signal OPT may be enabled to have a logic "high" level for execution of the first test operation.

The first control circuit 110 may receive the chip identification signal CID and the open test signal OPT to generate the first selection signal SEL<1> enabled to have a logic "high" level, the first enablement signal EN_TSV<1> enabled to have a logic "high" level, and the first test datum TD<1> having a logic "low" level. The first control circuit 110 may receive the chip identification signal CID and the open test signal OPT to generate the first open switch signal OP_SW<1> which is enabled to have a logic "low" level.

The second control circuit 310 may receive the chip identification signal CID and the open test signal OPT to generate the second enablement signal EN_TSV<2> enabled to have a logic "high" level and the second test datum TD<2> having a logic "low" level.

The first test circuit 120 may drive a level of the first through electrode 23 to a logic "low" level based on the first enablement signal EN_TSV<1> and the first test datum TD<1>. The first test circuit 120 may electrically connect the first test resistor R21 to the first through electrode 23 in response to the first open switch signal OP_SW<1>.

The first connection circuit 320 may electrically connect the first through electrode 23 to the ground voltage VSS terminal based on the second enablement signal EN_TSV<2> and the second test datum TD<2>.

The first test circuit 120 may detect a voltage level of the first internal node nd11 to generate the first flag signal FLAG<1> having a logic "high" level.

At the point in time "T2", the first control circuit 110 may receive the chip identification signal CID and the open test signal OPT to generate the second open switch signal OP_SW<2> which is enabled to have a logic "low" level.

The second test circuit 130 may drive a level of the second through electrode 24 to a logic "low" level based on the first enablement signal EN_TSV<1> and the first test datum TD<1>. The second test circuit 130 may electrically connect the second test resistor (not shown) to the second through electrode 24 in response to the second open switch signal OP_SW<2>.

The second connection circuit 330 may electrically connect the second through electrode 24 to the ground voltage VSS terminal based on the second enablement signal EN_TSV<2> and the second test datum TD<2>.

The second test circuit 130 may detect a voltage level of the second internal node (not shown) to generate the second flag signal FLAG<2> having a logic "low" level.

The first test operation for the third through electrode 25 may be the same as the above mentioned operation performed at the first point in time "T1", and the first test operation for the fourth through electrode 26 may be the same as the above mentioned operation performed at the second point in time "T2". Thus, the first test operations for the third and fourth through electrodes 25 and 26 will be omitted hereinafter.

At the point in time "T3", the synthesis signal generation circuit 161 may synthesize the first to fourth flag signals FLAG<1:4> to generate the synthesis signal SUM having a logic "low" level.

At the point in time "T4", the output control signal generation circuit 162 may generate the output control signal OUT_CON having a logic "high" level because the open test signal OPT is disabled to have a logic "low" level.

The detection signal generation circuit 163 may generate the detection signal TSV_DET having a logic "low" level from the synthesis signal SUM because the output control signal OUT_CON is enabled to have a logic "high" level.

According to the above description, the detection signal TSV_DET may be generated to have a logic "low" level when the second through electrode 24 among the first to fourth through electrodes 23~26 has the open failure. Thus, the semiconductor device 1 may recognize that at least one of the first to fourth through electrodes 23~26 has the open failure.

Figure 18:
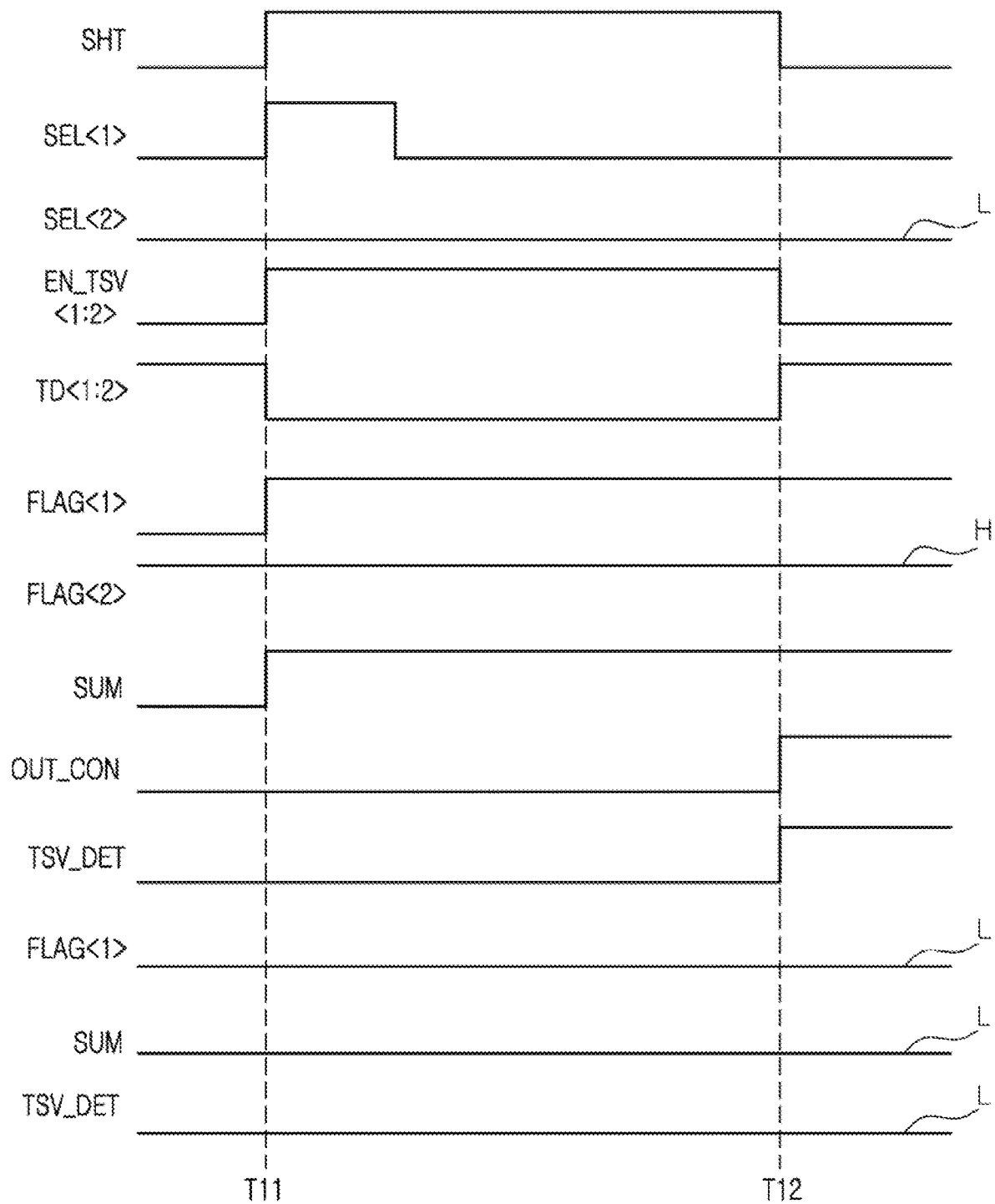

The second test operation according to an embodiment will be described hereinafter with reference to FIG. 18 in conjunction with an example in which no short failure exists between the first and second through electrodes 23 and 24 and an example in which the short failure exists between the first and second through electrodes 23 and 24.

First, the example in which no short failure exists between the first and second through electrodes 23 and 24 will be described hereinafter.

At a point in time "T11", the short test signal SHT may be enabled to have a logic "high" level for execution of the second test operation.

The first control circuit 110 may receive the chip identification signal CID and the short test signal SHT to generate the first selection signal SEL<1> enabled to have a logic "high" level, the first enablement signal EN_TSV<1> enabled to have a logic "high" level, and the first test datum TD<1> having a logic "low" level. The first control circuit 110 may receive the chip identification signal CID and the short test signal SHT to generate the first short switch signal SH_SW<1> which is enabled to have a logic "low" level.

The second control circuit 310 may receive the chip identification signal CID and the short test signal SHT to generate the second enablement signal EN_TSV<2> enabled to have a logic "high" level and the second test datum TD<2> having a logic "low" level.

The first test circuit 120 may drive a level of the first through electrode 23 to a logic "low" level based on the first enablement signal EN_TSV<1> and the first test datum TD<1>. The first test circuit 120 may electrically connect the third test resistor R22 to the first through electrode 23 in response to the first short switch signal SH_SW<1>.

The second connection circuit 330 may electrically connect the second through electrode 24 to the ground voltage VSS terminal based on the second enablement signal EN_TSV<2> and the second test datum TD<2>.

The first test circuit 120 may detect a voltage level of the first internal node nd11 to generate the first flag signal FLAG<1> having a logic "high" level. In such a case, the second to fourth flag signals FLAG<2:4> may be generated to have a logic "high" level.

The synthesis signal generation circuit 161 may synthesize the first to fourth flag signals FLAG<1:4> to generate the synthesis signal SUM having a logic "high" level.

At a point in time "T12", the output control signal generation circuit 162 may generate the output control signal OUT_CON having a logic "high" level because the short test signal SHT is disabled to have a logic "low" level.

The detection signal generation circuit 163 may generate the detection signal TSV_DET having a logic "high" level from the synthesis signal SUM because the output control signal OUT_CON is enabled to have a logic "high" level.

According to the above description, the detection signal TSV_DET may be generated to have a logic "high" level when no short failure exists between the first and second through electrodes 23 and 24. Thus, the semiconductor device 1 may recognize that no short failure exists between the first to fourth through electrodes 23~26.

Next, the example in which the short failure exists between the first and second through electrodes 23 and 24 will be described hereinafter.

At the point in time "T11", the short test signal SHT may be enabled to have a logic "high" level for execution of the second test operation.

The first control circuit 110 may receive the chip identification signal CID and the short test signal SHT to generate the first selection signal SEL<1> enabled to have a logic "high" level, the first enablement signal EN_TSV<1> enabled to have a logic "high" level, and the first test datum TD<1> having a logic "low" level. The first control circuit 110 may receive the chip identification signal CID and the short test signal SHT to generate the first short switch signal SH_SW<1> which is enabled to have a logic "low" level.

The second control circuit 310 may receive the chip identification signal CID and the short test signal SHT to generate the second enablement signal EN_TSV<2> enabled to have a logic "high" level and the second test datum TD<2> having a logic "low" level.

The first test circuit 120 may drive a level of the first through electrode 23 to a logic "low" level based on the first enablement signal EN_TSV<1> and the first test datum TD<1>. The first test circuit 120 may electrically connect the third test resistor R22 to the first through electrode 23 in response to the first short switch signal SH_SW<1>.

The second connection circuit 330 may electrically connect the second through electrode 24 to the ground voltage VSS terminal based on the second enablement signal EN_TSV<2> and the second test datum TD<2>.

The first test circuit 120 may detect a voltage level of the first internal node nd11 to generate the first flag signal FLAG<1> having a logic "low" level. In such a case, the second to fourth flag signals FLAG<2:4> may be generated to have a logic "high" level.

The synthesis signal generation circuit 161 may synthesize the first to fourth flag signals FLAG<1:4> to generate the synthesis signal SUM having a logic "low" level.

At the point in time "T12", the output control signal generation circuit 162 may generate the output control signal OUT_CON having a logic "high" level because the short test signal SHT is disabled to have a logic "low" level.

The detection signal generation circuit 163 may generate the detection signal TSV_DET having a logic "low" level from the synthesis signal SUM because the output control signal OUT_CON is enabled to have a logic "high" level.

According to the above description, the detection signal TSV_DET may be generated to have a logic "low" level when the short failure exists between the first and second through electrodes 23 and 24. Thus, the semiconductor device 1 may recognize that the short failure exists between the first to fourth through electrodes 23~26.

As described above, a semiconductor device according to an embodiment may electrically connect a plurality of through electrodes to test resistors having resistance values corresponding to the open failure or the short failure and may detect voltage levels of internal nodes connected to the plurality of through electrodes to test the open failure or the short failure of the plurality of through electrodes.

What is claimed is:

1. A semiconductor device comprising:
a first semiconductor chip; and
a second semiconductor chip stacked on the first semiconductor chip and electrically connected to the first semiconductor chip by a first through electrode and a second through electrode,
wherein the first semiconductor chip electrically connects the first and second through electrodes to first and second test resistors during a first test operation, and
wherein the first semiconductor chip detects voltage levels of first and second internal nodes coupled to the first and second through electrodes, respectively, the voltage levels of the first and second internal nodes are determined by resistance values of the first and second test resistors and the first and second through electrodes, to test open failures of the first and second through electrodes during the first test operation.

2. The semiconductor device of claim 1,
wherein the resistance value of the first test resistor is set to correspond to a resistance value of the first through electrode which is regarded as a normal through electrode without the open failure; and
wherein the resistance value of the second test resistor is set to correspond to a resistance value of the second through electrode which is regarded as a normal through electrode without the open failure.

3. The semiconductor device of claim 1,
wherein the first semiconductor chip is configured to include a first test control circuit; and
wherein when an open test signal is enabled to perform the first test operation, the first test control circuit is configured to sequentially connect the first and second test resistors to respective ones of the first and second through electrodes and is configured to detect the voltage levels of the first and second internal nodes to sequentially test the open failures of the first and second through electrodes.

4. The semiconductor device of claim 3, wherein the first test control circuit includes:
a first control circuit configured to generate a first enablement signal and a first test datum which are enabled when a chip identification signal and an open test signal are enabled and configured to generate first and second open switch signals which are sequentially enabled when the chip identification signal and the open test signal are enabled;
a first test circuit configured to drive the first through electrode to a predetermined logic level based on the first enablement signal and the first test datum, configured to electrically connect the first test resistor to the first through electrode when the first open switch signal is enabled, and configured to detect a voltage level of the first internal node to generate a first flag signal;
a second test circuit configured to drive the second through electrode to the predetermined logic level based on the first enablement signal and the first test datum, configured to electrically connect the second test resistor to the second through electrode when the second open switch signal is enabled, and configured to detect a voltage level of the second internal node to generate a second flag signal; and
a sense circuit configured to synthesize the first and second flag signals to generate a detection signal when the open test signal is enabled.

5. The semiconductor device of claim 4, wherein the first control circuit includes:
a selection signal generation circuit configured to generate first and second selection signals which are sequentially enabled when the chip identification signal and the open test signal are enabled;
a logic circuit configured to generate the first enablement signal and the first test datum which are enabled when the open test signal is enabled; and
a first switch signal generation circuit configured to generate the first and second open switch signals from the first and second selection signals when the open test signal is enabled.

6. The semiconductor device of claim 4, wherein the first test circuit includes:
a first resistor connection circuit coupled between a power supply voltage terminal and the first internal node connected to the first through electrode and configured to connect the first test resistor to the first internal node when the first open switch signal is enabled;
a first transmitter configured to drive the first through electrode to the predetermined logic level based on the first enablement signal and the first test datum;
a first receiver configured to detect a voltage level of the first internal node to generate a first internal detection signal; and
a first output circuit configured to generate the first flag signal from the first internal detection signal when the open test signal is enabled.

7. The semiconductor device of claim 6,
wherein the first transmitter includes:
a first pull-up/pull-down signal generation circuit configured to inversely buffer the first test datum to generate a first pull-up signal when the first enablement signal is enabled and to inversely buffer the first test datum to generate a first pull-down signal when the first enablement signal is enabled, and a first drive circuit configured to pull up a voltage level of the first internal node to a power supply voltage based on the first pull-up signal and to pull down a voltage level of the first internal node to a ground voltage based on the first pull-down signal, and wherein the first receiver is configured to buffer the voltage signal of the first internal node to generate the first internal detection signal.

8. The semiconductor device of claim 4, wherein the second test circuit includes:
  a second resistor connection circuit coupled between a power supply voltage terminal and the second internal node connected to the second through electrode and configured to connect the second test resistor to the second internal node when the second open switch signal is enabled;
  a second transmitter configured to drive the second through electrode to the predetermined logic level based on the first enablement signal and the first test datum;
  a second receiver configured to detect a voltage level of the second internal node to generate a second internal detection signal; and
  a second output circuit configured to generate the second flag signal from the second internal detection signal when the open test signal is enabled.

9. The semiconductor device of claim 1, wherein the second semiconductor chip includes a second test control circuit that electrically connects the first and second through electrodes to a ground voltage terminal when an open test signal is enabled to perform the first test operation.

10. The semiconductor device of claim 9, wherein the second test control circuit includes:
  a second control circuit configured to generate a second enablement signal and a second test datum which are enabled when a chip identification signal and the open test signal are enabled;
  a first connection circuit configured to electrically connect the first through electrode to the ground voltage terminal based on the second enablement signal and the second test datum; and
  a second connection circuit configured to electrically connect the second through electrode to the ground voltage terminal based on the second enablement signal and the second test datum.

11. The semiconductor device of claim 10, wherein the first connection circuit includes a third transmitter that electrically connects a third internal node connected to the first through electrode to the ground voltage terminal based on the second enablement signal and the second test datum.

12. The semiconductor device of claim 10, wherein the second connection circuit includes a fourth transmitter that electrically connects a fourth internal node connected to the second through electrode to the ground voltage terminal based on the second enablement signal and the second test datum.

13. The semiconductor device of claim 1,
  wherein the first semiconductor chip electrically connects the first through electrode to a third test resistor during a second test operation, and
  wherein the first semiconductor chip detects a voltage level of the first internal node, which is determined by resistance values of the third test resistor and the first and second through electrodes, to test a short failure between the first and second through electrodes during the second test operation.

14. The semiconductor device of claim 13, wherein the resistance value of the third test resistor is set to correspond to a resistance value between the first and second through electrodes when no short failure occurs between the first and second through electrodes.

15. A semiconductor device comprising:
  a first semiconductor chip; and
  a second semiconductor chip stacked on the first semiconductor chip and electrically connected to the first semiconductor chip by a first through electrode and a second through electrode,
  wherein during a first test operation, the first semiconductor chip is configured to electrically connect the first and second through electrodes to first and second test resistors and is configured to detect voltage levels of first and second internal nodes, which are determined by resistance values of the first and second test resistors and the first and second through electrodes, to test open failures of the first and second through electrodes, and
  wherein during a second test operation, the first semiconductor chip is configured to electrically connect the first through electrode to a third test resistor and is configured to detect a voltage level of the first internal node, which is determined by resistance values of the third test resistor and the first and second through electrodes, to test a short failure between the first and second through electrodes.

16. The semiconductor device of claim 15,
  wherein the resistance value of the first test resistor is set to correspond to a resistance value of the first through electrode which is regarded as a normal through electrode without the open failure; and
  wherein the resistance value of the second test resistor is set to correspond to a resistance value of the second through electrode which is regarded as a normal through electrode without the open failure.

17. The semiconductor device of claim 15, wherein the resistance value of the third test resistor is set to correspond to a resistance value between the first and second through electrodes when the short failure does not occur between the first and second through electrodes.

18. The semiconductor device of claim 15, wherein the resistance value of the third test resistor is set to be greater than the resistance values of the first and second test resistors.

19. The semiconductor device of claim 15,
  wherein the first semiconductor chip is configured to include a first test control circuit;
  wherein when an open test signal is enabled to perform the first test operation, the first test control circuit is configured to sequentially connect the first and second test resistors to respective ones of the first and second through electrodes and is configured to detect the voltage levels of the first and second internal nodes to sequentially test the open failures of the first and second through electrodes; and
  wherein when a short test signal is enabled to perform the second test operation, the first test control circuit is configured to electrically connect the third test resistor to the first through electrode and is configured to detect a voltage level of the first internal node to test the short failure between the first and second through electrodes.

20. The semiconductor device of claim 19, wherein the first test control circuit includes:
  a first control circuit configured to generate a first enablement signal and a first test datum which are enabled when a chip identification signal is enabled and any one of the open test signal and the short test signal is enabled, configured to generate first and second open switch signals which are sequentially enabled when the chip identification signal and the open test signal are enabled, and configured to generate a short switch signal which is enabled when the chip identification signal and the short test signal are enabled;

a first test circuit configured to drive the first through electrode to a predetermined logic level based on the first enablement signal and the first test datum, configured to electrically connect the first test resistor to the first through electrode when the first open switch signal is enabled, configured to electrically connect the third test resistor to the first through electrode when the short switch signal is enabled, and configured to detect a voltage level of the first internal node to generate a first flag signal;

a second test circuit configured to drive the second through electrode to the predetermined logic level based on the first enablement signal and the first test datum, configured to electrically connect the second test resistor to the second through electrode when the second open switch signal is enabled, and configured to detect a voltage level of the second internal node to generate a second flag signal; and a sense circuit configured to synthesize the first and second flag signals to generate a detection signal when the open test signal or the short test signal is enabled.

21. The semiconductor device of claim 20, wherein the first control circuit includes:

a selection signal generation circuit configured to generate first and second selection signals which are sequentially enabled when the chip identification signal and the open test signal are enabled and configured to generate the first selection signal which is enabled when the chip identification signal and the short test signal are enabled;

a logic circuit configured to generate the first enablement signal and the first test datum which are enabled when at least one of the open test signal and the short test signal is enabled; and a first switch signal generation circuit configured to generate the first and second open switch signals from the first and second selection signals when the open test signal is enabled and configured to generate the short switch signal from the first selection signal when the short test signal is enabled.

22. The semiconductor device of claim 20, wherein the first test circuit includes:

a first resistor connection circuit coupled between a power supply voltage terminal and the first internal node connected to the first through electrode, configured to connect the first test resistor to the first internal node when the first open switch signal is enabled, and configured to connect the third test resistor to the first internal node when the short switch signal is enabled;

a first transmitter configured to drive the first through electrode to the predetermined logic level based on the first enablement signal and the first test datum;

a first receiver configured to detect a voltage level of the first internal node to generate a first internal detection signal; and a first output circuit configured to generate the first flag signal from the first internal detection signal when at least one of the open test signal and the short test signal is enabled.

23. The semiconductor device of claim 20, wherein the second test circuit includes:

a second resistor connection circuit coupled between a power supply voltage terminal and the second internal node connected to the second through electrode and configured to connect the second test resistor to the second internal node when the second open switch signal is enabled;

a second transmitter configured to drive the second through electrode to the predetermined logic level based on the first enablement signal and the first test datum;

a second receiver configured to detect a voltage level of the second internal node to generate a second internal detection signal; and a second output circuit configured to generate the second flag signal from the second internal detection signal when the open test signal is enabled.

24. The semiconductor device of claim 15, wherein the second semiconductor chip includes a second test control circuit that electrically connects the first and second through electrodes to a ground voltage terminal when at least one of an open test signal is enabled to perform the first test operation and a short test signal is enabled to perform the second test operation.

25. The semiconductor device of claim 24, wherein the second test control circuit includes:

a second control circuit configured to generate a second enablement signal and a second test datum which are enabled when a chip identification signal is enabled and any one of the open test signal and the short test signal is enabled;

a first connection circuit configured to electrically connect the first through electrode to the ground voltage terminal based on the second enablement signal and the second test datum; and a second connection circuit configured to electrically connect the second through electrode to the ground voltage terminal based on the second enablement signal and the second test datum.

26. The semiconductor device of claim 25, wherein the first connection circuit includes a third transmitter that electrically connects a third internal node connected to the first through electrode to the ground voltage terminal based on the second enablement signal and the second test datum.

27. The semiconductor device of claim 25, wherein the second connection circuit includes a fourth transmitter that electrically connects a fourth internal node connected to the second through electrode to the ground voltage terminal based on the second enablement signal and the second test datum.

28. A semiconductor device comprising:

a first semiconductor chip; and a second semiconductor chip stacked on the first semiconductor chip and electrically connected to the first semiconductor chip by a first through electrode and a second through electrode, wherein the first semiconductor chip electrically connects the first through electrode to a third test resistor during a second test operation, and wherein the first semiconductor chip detects a voltage level of the first internal node, which is determined by resistance values of the third test resistor and the first and second through electrodes, to test a short failure between the first and second through electrodes during the second test operation.

* * * * *